(12) United States Patent
Ashrafzadeh et al.

(10) Patent No.: US 9,177,925 B2
(45) Date of Patent: Nov. 3, 2015

(54) APPARATUS RELATED TO AN IMPROVED PACKAGE INCLUDING A SEMICONDUCTOR DIE

(71) Applicant: Fairchild Semiconductor Corporation, San Jose, CA (US)

(72) Inventors: Ahmad R. Ashrafzadeh, Morgan Hill, CA (US); Vijay G. Ullal, Saratoga, CA (US); Justin Chiang, Piedmont, CA (US); Daniel Kinzer, El Segundo, CA (US); Michael M. Dube, Saco, ME (US); Oseob Jeon, Seoul (KR); Chung-Lin Wu, San Jose, CA (US); Maria Cristina Estacio, Lapulapu (PH)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 14/092,485

(22) Filed: Nov. 27, 2013

(65) Prior Publication Data

US 2014/0312458 A1 Oct. 23, 2014

Related U.S. Application Data

(60) Provisional application No. 61/813,514, filed on Apr. 18, 2013.

(51) Int. Cl.
*H01L 23/48* (2006.01)
*H01L 23/64* (2006.01)
(Continued)

(52) U.S. Cl.
CPC .......... *H01L 23/645* (2013.01); *H01L 23/3121* (2013.01); *H01L 23/5389* (2013.01); *H01L 24/19* (2013.01); *H01L 25/16* (2013.01); *H01L 23/145* (2013.01); *H01L 23/147* (2013.01); *H01L 23/15* (2013.01); *H01L 2224/0401* (2013.01); *H01L 2224/06181* (2013.01);
(Continued)

(58) Field of Classification Search
CPC ............. H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657
USPC ......... 257/531, 532, 777–778, 787, 788, 790, 257/685–686
See application file for complete search history.

(56) References Cited

U.S. PATENT DOCUMENTS 7,678,609 B2  3/2010  Pavier
7,737,871 B2  6/2010  Leung et al.
(Continued)

OTHER PUBLICATIONS

Lim, Michele Hui Fern, "Low Temperature Co-fired Ceramics Technology for Power Magnetics Integration", Nov. 17, 2008, 226 pages.
(Continued)

*Primary Examiner* — Hoa B Trinh
(74) *Attorney, Agent, or Firm* — Brake Hughes Bellermann LLP

(57) ABSTRACT

In one general aspect, a method can include forming a redistribution layer on a substrate using a first electroplating process, and forming a conductive pillar on the redistribution layer using a second electroplating process. The method can include coupling a semiconductor die to the redistribution layer, and can include forming a molding layer encapsulating at least a portion of the redistribution layer and at least a portion of the conductive pillar.

29 Claims, 24 Drawing Sheets

(51) Int. Cl.
*H01L 23/31* (2006.01)
*H01L 23/538* (2006.01)
*H01L 23/00* (2006.01)
*H01L 25/16* (2006.01)
*H01L 23/14* (2006.01)
*H01L 23/15* (2006.01)

(52) U.S. Cl.
CPC ............... *H01L 2224/16225* (2013.01); *H01L 2224/32245* (2013.01); *H01L 2224/73267* (2013.01); *H01L 2924/1305* (2013.01); *H01L 2924/1306* (2013.01); *H01L 2924/13055* (2013.01); *H01L 2924/13091* (2013.01); *H01L 2924/1431* (2013.01); *H01L 2924/1433* (2013.01); *H01L 2924/1532* (2013.01); *H01L 2924/15787* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/19107* (2013.01)

(56) References Cited

U.S. PATENT DOCUMENTS

| | | |
|---|---|---|
| 7,838,964 B2 | 11/2010 | Carobolante et al. |
| 7,902,627 B2 | 3/2011 | Dong et al. |
| 8,088,645 B2 | 1/2012 | Liu et al. |
| 8,110,474 B2 | 2/2012 | Carobolante et al. |
| 8,169,108 B2 | 5/2012 | Dupuis et al. |
| 8,188,814 B2 | 5/2012 | Ng et al. |
| 8,344,464 B2 | 1/2013 | Cho |
| 8,421,204 B2 | 4/2013 | Liu et al. |
| 8,497,573 B2 | 7/2013 | Cho et al. |
| 8,525,334 B2 | 9/2013 | Cardwell |
| 8,614,503 B2 | 12/2013 | Cho |
| 2006/0267159 A1 | 11/2006 | Yamamoto et al. |
| 2007/0040238 A1 | 2/2007 | Yamasaki et al. |
| 2007/0062027 A1 | 3/2007 | Ripamonti et al. |
| 2007/0080587 A1 | 4/2007 | Ruizenaar et al. |
| 2010/0109123 A1 | 5/2010 | Strzalkowski et al. |
| 2011/0013349 A1 | 1/2011 | Morikita et al. |
| 2011/0018136 A1 | 1/2011 | Bedair et al. |
| 2011/0285215 A1 | 11/2011 | Hatase |
| 2014/0071650 A1 | 3/2014 | Flores et al. |

OTHER PUBLICATIONS

European Search Report from correspondence application EP 14001300.4, dated Feb. 20, 2015, 7 pages.

Extended European Search Report for European Application No. 14001300.4, mailed Jun. 17, 2015, 11 pages.

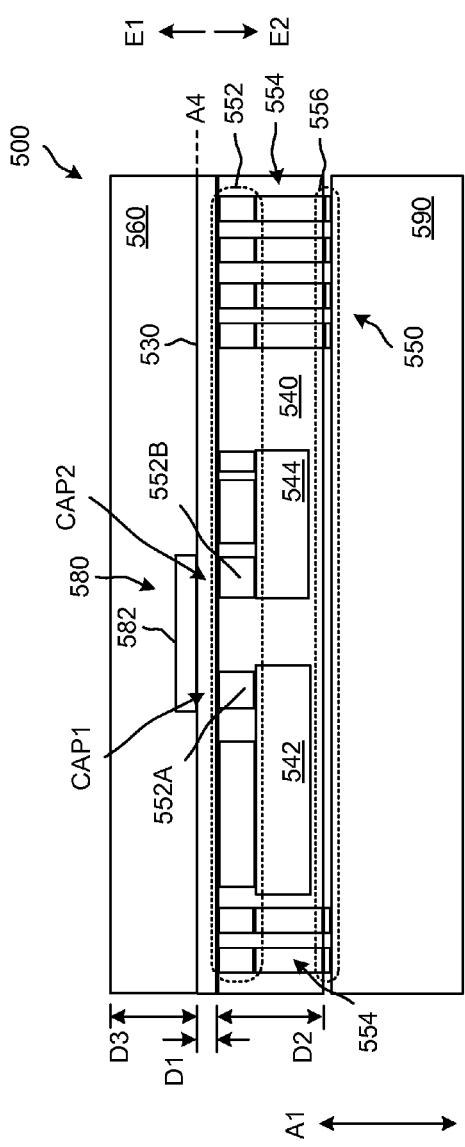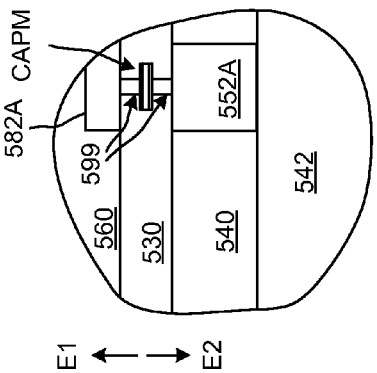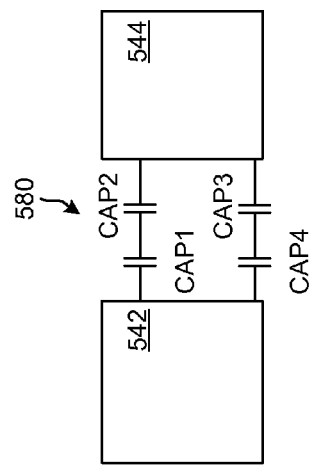
FIG. 5A
FIG. 5B
FIG. 5C

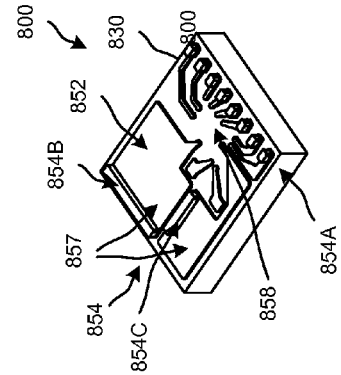
FIG. 8C
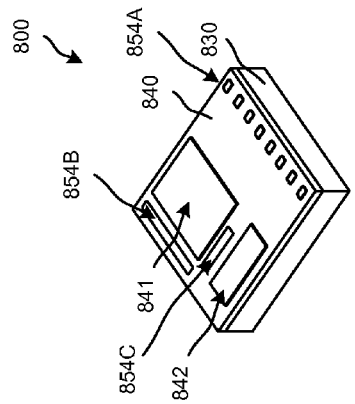
FIG. 8F
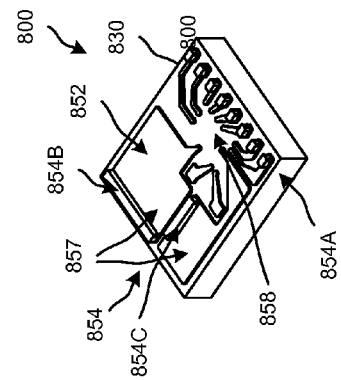
FIG. 8B
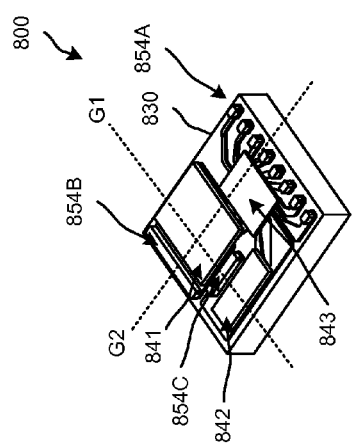
FIG. 8E
FIG. 8A
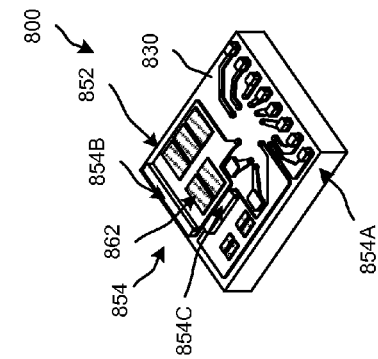
FIG. 8D

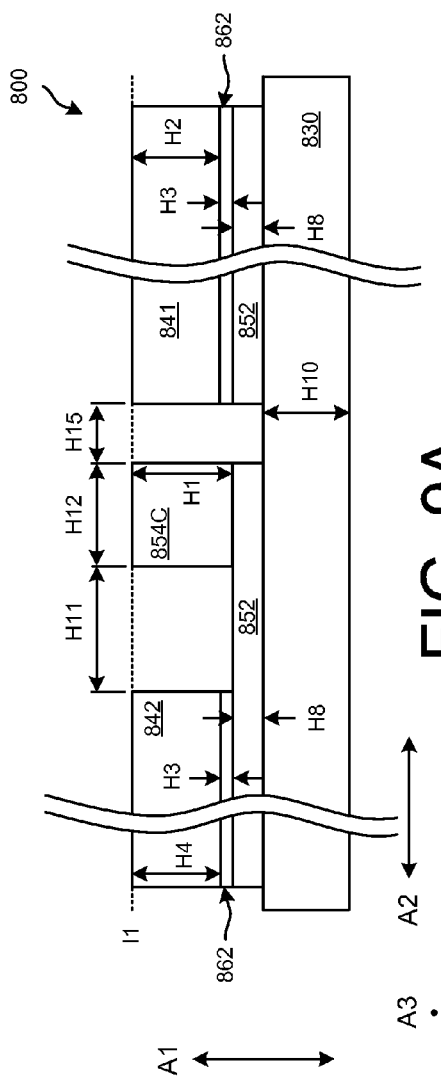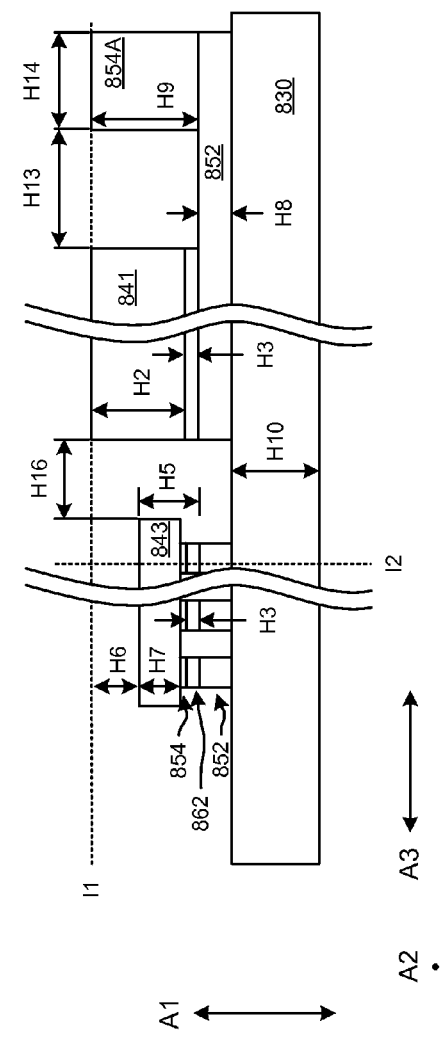

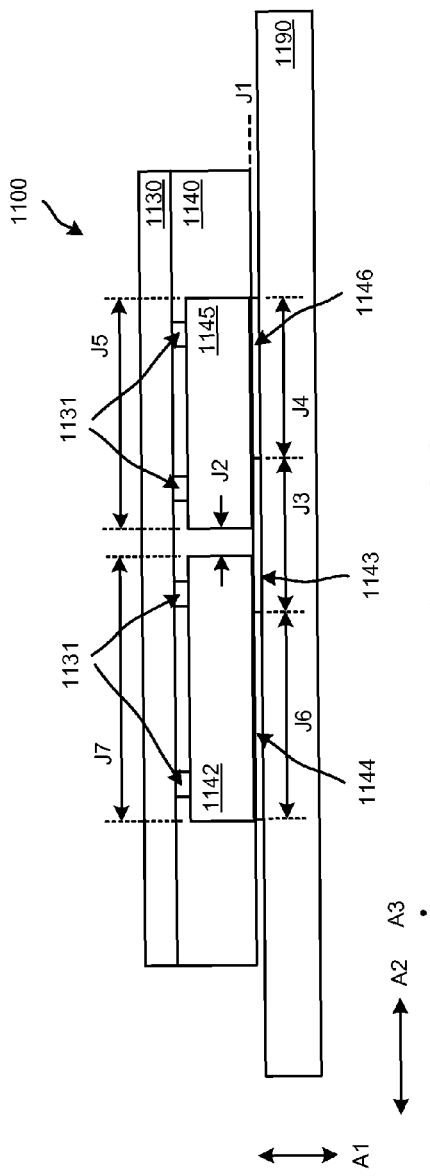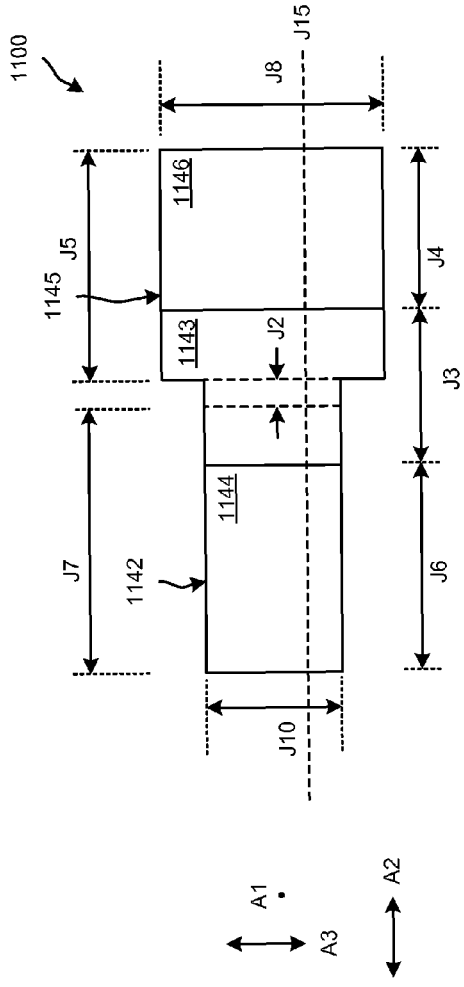
FIG. 11A
FIG. 11B

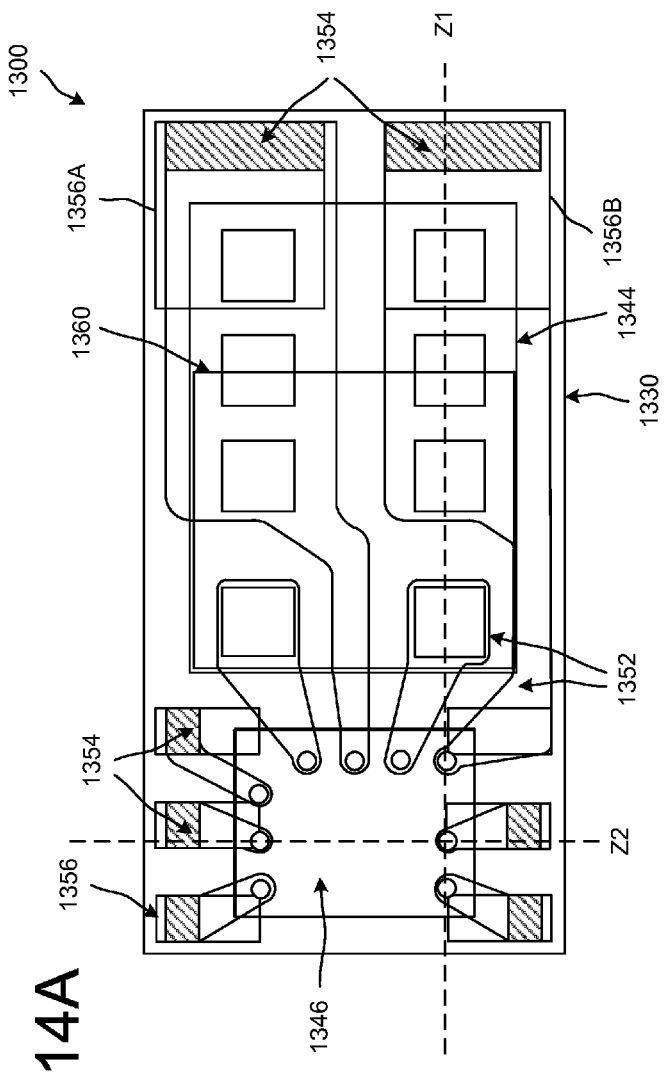

APPARATUS RELATED TO AN IMPROVED PACKAGE INCLUDING A SEMICONDUCTOR DIE

RELATED APPLICATION

This application claims priority to and the benefit of U.S. Provisional Application No. 61/813,514, entitled, "Methods and Apparatus Related to an Improved Package Including a Semiconductor Die," filed Apr. 18, 2013, which is incorporated herein by reference in its entirety.

TECHNICAL FIELD

This description is associated with methods and apparatus related to an improved package including a semiconductor die.

BACKGROUND

As the world of electronics moves towards smaller sizes, higher efficiency, and lower cost, integration techniques are in great demand for making smaller, more intelligent and more efficient products, in a variety of spaces including the power management space. The highest performance devices, such as power devices, are often manufactured discretely as opposed to being integrated in an integrated circuit (IC) process. The cost of producing such discrete devices can be a fraction of those produced using such complex processes because the mask layers used in discrete devices are generally a fraction (e.g., one half, one third) of the number of those used in more complex IC processes. Many known approaches have used, for example, lead-frame packages and copper clips to achieve integration, but the shortcomings of such packages have been higher cost, inferior thermal performance, higher inductance, larger size and generally a lower level of integration. Thus, a need exists for systems, methods, and apparatus to address the shortfalls of present technology and to provide other new and innovative features.

SUMMARY

In one general aspect, a method can include forming a redistribution layer on a substrate using a first electroplating process, and forming a conductive pillar on the redistribution layer using a second electroplating process. The method can include coupling a semiconductor die to the redistribution layer, and can include forming a molding layer encapsulating at least a portion of the redistribution layer and at least a portion of the conductive pillar.

The details of one or more implementations are set forth in the accompanying drawings and the description below. Other features will be apparent from the description and drawings, and from the claims.

BRIEF DESCRIPTION OF THE DRAWINGS

FIG. 5A is a side cross-sectional view of yet another device, or a portion thereof, according to an implementation.

FIG. 5B is a diagram that illustrates an equivalent circuit of the capacitive component and the semiconductor die shown in FIG. 5A.

FIG. 5C is a side cross-sectional view of a variation of a portion of the device shown in FIG. 5A.

FIGS. 8A through 8H are diagrams that illustrate a perspective view of formation of a device.

FIGS. 9A and 9B illustrates cross-sectional views of the device shown in FIG. 8E.

FIG. 11A is a diagram that illustrates a side cross-sectional view of a device coupled to an external block.

FIG. 11B is a bottom view of the device shown in FIG. 11A.

FIG. 14A is a diagram that illustrates a layout view of the device shown in FIGS. 13A and 13B.

FIG. 14B illustrates a side cross-sectional view of the device shown in FIG. 14A along a line.

DETAILED DESCRIPTION

Figure 1:
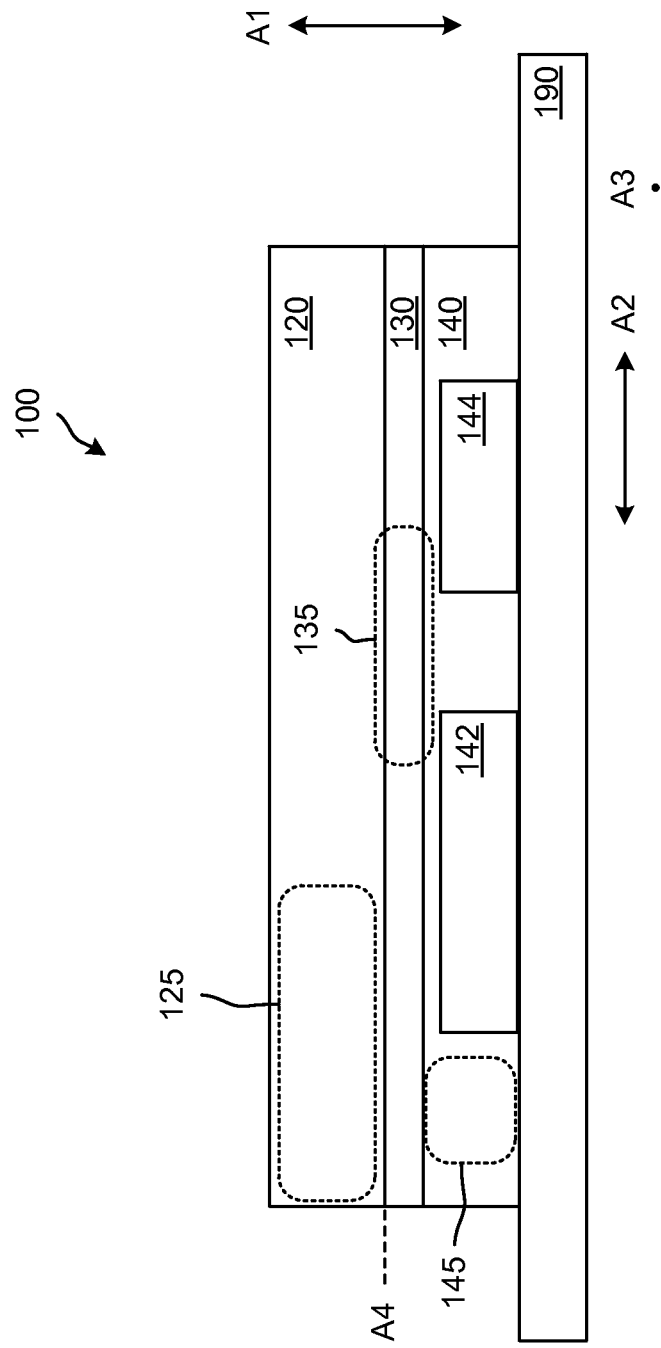
FIG. 1 is a diagram that illustrates a side cross-sectional view of a device including several different components integrated into a package.

FIG. 1 is a diagram that illustrates a side cross-sectional view of a device 100 including several different components integrated into a package. In some implementations, the device 100 can be referred to as a packaged device or can be referred to as a package. The device 100 can be coupled to an external block 190 (e.g., a printed circuit board, a lead frame) or another device (not shown).

As shown in FIG. 1, the device 100 includes a substrate 130 disposed between a molding layer 120 and a molding layer 140. In some implementations, the substrate 130 can be referred to as an inter-molding substrate because the substrate 130 is disposed between two different molding layers 120, 140. In some implementations, the substrate 130 can function as an insulator between the molding layers 120, 140. In some implementations, the substrate 130 can function as a structural component for the device 100. In this implementation, several semiconductor die 142, 144 are disposed within the molding layer 140. In some implementations, the molding layers 120, 140 can each be referred to as a molding without the term layer and/or can be referred to as a molding material. In some implementations, the molding material can include, or can be, a molding compound. Accordingly, one or more of the molding layers 120, 140 can include more than one type of material (e.g., a plastic, a resin, an epoxy, a phenolic hardener, a silica material, a pigment, etc.) in the molding material.

As shown in FIG. 1, the molding layer 120, the substrate 130, the molding layer 140, and the external block 190 are stacked along a direction A1 (also can be referred to as a vertical direction). The molding layer 120, the substrate 130, the molding layer 140, and the external block 190 can be referred to as being included in a vertical stack.

Each of the molding layer 120, the substrate 130, the molding layer 140, and the external block 190 are aligned along a direction A2 (also can be referred to as a horizontal direction or as a lateral direction), which is substantially orthogonal to the direction A1. The direction A2 is aligned along or parallel to a plane A4, along which the molding layers 120, 140, the semiconductor die 142, 144, the substrate 130, and the external block 190 are also aligned. In some implementations, a portion of the device 100, or a direction away from the external block 190 (substantially along the direction A1), can be referred to as top portion or an upward direction. In some implementations, a portion of the device 100, or a direction toward the external block 190 (substantially along the direction A1), can be referred to as bottom portion or a downward direction. A direction A3 into the page (shown as a dot) is aligned along or parallel to the plane A4 and is orthogonal to directions A1 and A2. In the implementations described herein, the vertical direction is normal to a plane along which the substrate 130 is aligned (e.g., the plane A4). The directions A1, A2, and A3, and plane A4, are used throughout the various views of the implementations described throughout the figures for simplicity.

In this implementation shown in FIG. 1, the device 100 includes a passive component region 125 (also can be referred to as a passive device region) included in at least a portion of the molding layer 120, a passive component region 135 (also can be referred to as a passive device region) that is coupled to (e.g., uses, is on, is at least partially disposed within, is embedded within) at least a portion of the substrate 130, and an interconnection region 145 included in at least a portion of the molding layer 140. One or more components (e.g., passive devices) that can be included in one or more of the passive component regions 125, 135 can include, for example, a capacitive component (e.g., a capacitor), an inductive component (e.g., an inductor, a transformer), a resistive component (e.g., a resistor), and/or so forth.

As a specific example, a capacitive component (not shown) can be formed using at least a portion of the substrate 130 as an integral element (e.g., a dielectric) in the construction or formation of the capacitive component. As another example, at least a portion of a capacitive component (e.g., a thin-film capacitive component, a capacitive component including a co-fired dielectric) can be embedded in the substrate 130.

As yet another specific example, one or more inductive components (not shown) can be formed in the passive component region 125 of the molding layer 120. Accordingly, the inductive component(s) can be included in a top portion of the device 100. In some implementations, the molding layer 120 can include, or can be, at least a portion of a magnetic substance. Accordingly, one or more conductors can be combined with the magnetic substance to form the inductive component(s). In some implementations, integration of one or more components including a magnetic substance in the molding layer 120 can be referred to as magnetic integration.

Although not shown in FIG. 1, one or more electrical connections using one or more conductors (e.g., vias) can be formed through the substrate 130 to, for example, an inductive component included in the passive component region 125 of the molding layer 120. For example, an inductive component formed in the passive component region 125 of the molding layer 120 can be electrically connected to one or more of the semiconductor die 142, 144, one or more components included in the passive component region 135, and/or the external block 190 using one or more vias through the substrate 130.

As another example, one or more capacitive components (not shown) can be formed in the passive component region 135 using the substrate 130. Accordingly, at least some portions of the capacitive component(s) can be disposed in the molding layer 120 and/or the molding layer 140. As a specific example, a capacitive component can include a first capacitive plate (e.g., a conductive plate made of copper) disposed on a first side of the substrate 130 in the molding layer 120, and can include a second capacitive plate disposed on a second side of the substrate 130 in the molding layer 140 and opposite the first side of the substrate 130. At least a portion of the substrate 130 disposed between the first capacitive plate and the second capacitive plate can function as a dielectric for the capacitive component.

In some implementations, one or more components formed in the passive component region 135 using the substrate 130 can be used for various functions. For example, a capacitive component formed in the passive component region 135 using the substrate 130 can be used for isolating communication signaling between semiconductor devices included in the device 100. In some implementations, integration of one or more components using the substrate 130 for communication isolation (e.g., isolation at relatively high voltages) can be referred to as isolated communication integration.

In some implementations, the substrate 130 can be made of material configured to function as a dielectric at relatively high voltages (e.g., 100 V, 1000 V, 10,000 V). In some implementations, the substrate can be, or can include, an organic substrate, a polymer, a glass, and/or so forth. In some implementations, the substrate 130, can be, or can include, a ceramic material. In some implementations, the substrate 130 can be, or can include, for example, aluminum nitride (AlN), silicon nitride ($Si_3N_4$), alumina ($Al_2O_3$) or a derivative thereof, FR4, Barium Titanate ($BaTiO_3$), and/or so forth. The ceramic material can have a favorable coefficient of thermal expansion (CTE) compared with, for example, pure silicon. For example, a coefficient of the thermal expansion of the ceramic material (or other substrate material) can be similar a coefficient of the thermal expansion of silicon so that stress within the device 100 can be reduced at relatively high temperatures.

Although not shown in FIG. 1, one or more electrical connections using one or more conductors (e.g., vias) can be formed through the substrate 130 to, for example, a capacitive component included the passive component region 135 of the molding layer 120. For example, the capacitive component formed in the passive component region 135 can be electrically connected to one or more of the semiconductor die 142, 144, one or more components included in the passive component region 125, and/or the external block 190 using one or more vias through the substrate 130.

The interconnection region 145 can include one or more interconnection components that can be, or can include, a combination of conductive components that can be used to electrically interconnect portions of the device 100. The interconnection region 145 can include, for example, one or more redistribution layers (RDLs) (not shown) and one or more conductive pillars (not shown) coupled to the redistribution layer(s). The redistribution layer(s) and/or the conductive pillar(s) can be formed using a variety of processing techniques including deposition processing techniques, electroplating processing techniques, electroless plating processing techniques, and/or so forth. The interconnection components included in the interconnection region 145 can be coupled to one or more input pins and/or one or more output pins for the device 100.

As mentioned above, the interconnection components included in the interconnection region 145 can be used to electrically interconnect portions of the device 100 such as semiconductor devices included in one or more of the semiconductor die 142, 144. One or more of the semiconductor die 142, 144 can be electrically coupled to one or more passive components included in one or more of the passive component regions 125, 135 via one or more conductive components included in the interconnection region 145. In some implementations, one or more conductive components included in the interconnection region 145 can be used to electrically couple one or more passive components included in one or more of the passive component regions 125, 135 with the external block 190.

In some implementations, one or more of the semiconductor die 142, 144 can include a variety of semiconductor devices. For example, one or more of the semiconductor die 142, 144 can be, or can include, a discrete semiconductor device. Specifically, one or more of the semiconductor die 142, 144 can be, or can include, a laterally-oriented transistor device (e. g., a lateral metal-oxide-semiconductor field-effect transistor (MOSFET) device) and/or a vertically-oriented transistor device (e.g., a vertical MOSFET device). In some implementations, one or more of the semiconductor die 142, 144 can be, or can include, a bipolar junction transistor (BJT) device, a diode device, an insulated-gate bipolar transistor (IGBT) device, and/or so forth. In some implementations, one or more of the semiconductor die 142, 144 can be, or can include, a circuit such as a filter circuit, a controller circuit, a driver circuit, a communication circuit (e.g., a receiver and/or transmitter), and/or so forth. In some implementations, one or more of the semiconductor die 142, 144 can be, or can include special purpose logic circuitry, combinational logic, a field programmable gate array (FPGA), an application-specific integrated circuit (ASIC). Although not shown in FIG. 1, in some implementations, one or more semiconductor die (similar to one or more of the semiconductor die 142, 144) can be included in the molding layer 120. In some implementations, semiconductor die 142 and/or semiconductor die 144 can instead be a module (e.g., a discrete device module, a packaged device module).

In some implementations, the device 100 can be used for many different types of systems such as power management systems, radio frequency (RF) systems, controller systems, computing systems, digital and/or analog systems, etc. In some implementations, the device 100 can also be used for providing low cost and effective fan-out where the number of pins exceeds what the silicon die size and desired pitch can accommodate for.

As shown in FIG. 1, a variety of packaging technologies and techniques are heterogeneously integrated into the device 100 within the passive components regions 125, 135, the interconnection region 145, and other portions of the device 100. Passive components can be integrated into and operated within the device 100 for improved electrical/thermal performance, and reduced overall size, cost, and package impedance.

One or more of the passive component regions 125, 135, and/or the interconnection region 145 are illustrated as being included in specific portions of the device 100 by way of example only. In some implementations, additional passive component regions and/or interconnection regions can be included within the device 100. In some implementations, the passive component regions and/or interconnection regions can be electrically coupled and/or isolated using one or more insulators.

Accordingly, one or more of the passive component regions 125, 135 and/or the interconnection region 145 can be included in different locations within the device 100. For example, the passive component region 125 can be disposed above the passive component region 135. In some implementations, the interconnection region 145 can be disposed between the semiconductor die 142 and the semiconductor die 144. In some implementations, the interconnection region 145 (or an additional interconnection region) can be included in the molding layer 120.

As discussed in more detail below, a variety of combinations of integration can be included in the device 100. In some implementations, one or more different types of integration can be excluded from the device 100. For example, a variation of the device 100 can include the passive component region 135 and the interconnection region 145, but exclude the passive component region 125. As another example, a variation of the device 100 can include the passive component region 125 and the interconnection region 145, but can exclude the passive component region 135. As yet another example, a variation of the device 100 can include the passive component region 125, but exclude the passive component region 135 and the interconnection region 145.

As noted above, the external block 190 can be, for example, a lead frame, a package, and/or so forth. In some implementations, the device 100 (and variations thereof described below) can be coupled to a variety of other components. For example, the device 100 can be coupled to another device similar to the device 100. In some implementations, the device 100 can be molded into another component or circuit. In some implementations, the device 100 can be coupled via one or more wire bonds or other conductive components to the external block 190.

The device 100 shown in FIG. 1 can be produced using a variety of processing techniques. For example, the elements included on one side of the substrate 130 can be produced concurrently with the elements included on the other side of the substrate 130. For example, one or more portions of the passive component region 125 can be concurrently formed with one or more portions of the interconnection region 145 and/or the passive component region 135. In contrast, one or more portions of the passive component region 125 can be formed before or after one or more portions of the interconnection region 145 and/or the passive component region 135 are formed. More details related to processing operations that can be used to produce the device 100 (and/or variations thereof) are discussed below in connection with, for example, FIGS. 6A through 6G, 8A through 8H, and so forth. More details related to the device 100 shown in FIG. 1 and variations thereof are shown and described in connection with FIGS. 2A through 14C.

Figure 2A:
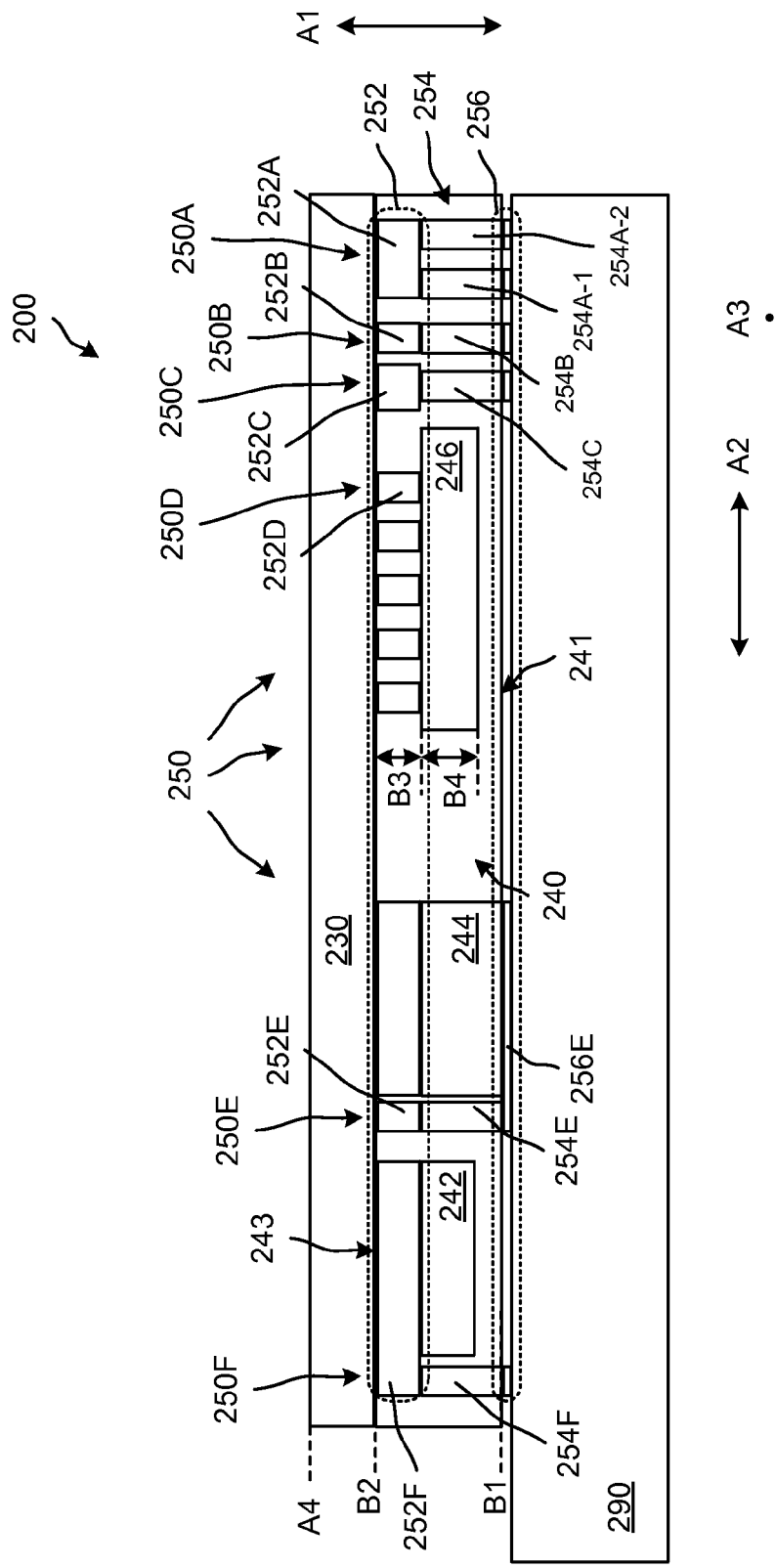
FIG. 2A is a side cross-sectional view of a device, or a portion thereof, according to an implementation.

FIG. 2A is a side cross-sectional view of a device 200, or a portion thereof, according to an implementation. As shown in FIG. 2A, the device 200 includes a plurality of interconnection components 250 coupled to a substrate 230. In this implementation, several of the interconnection components 250 are defined by portions of a redistribution layer 252 (which can be referred to as redistribution layer portions, or as contacts of the redistribution layer) and conductive pillars 254. In this implementation, the redistribution layer 252 is disposed between the substrate 230 and the conductive pillars 254 (which can be referred to as a conductive pillar layer). One or more portions of the interconnection components 250 can be included within an interconnection region (e.g., interconnection region 145 shown in FIG. 1). In this implementation, although the cross-section is cut along direction A2, one or more of the features can be included in a cross-section cut along direction A3.

As shown in FIG. 2A, the interconnection components 250 and semiconductor die 242, 244, and 246 are disposed within a molding layer 240 of the device 200. In other words, the interconnection components 250 (or portions thereof) and semiconductor die 242, 244, and 246 are at least partially disposed within the molding layer 240. In some implementations, the interconnection components 250 and/or semiconductor die 242, 244, and/or 246 can be entirely disposed within or encapsulated within the molding layer 240. The molding layer 240 is a relatively (or substantially) flat layer that has a surface 241 aligned along (e.g., substantially aligned along) a plane B1, and a surface 243 (e.g., an opposite surface) aligned along (e.g., substantially aligned along) a plane B2. In some implementations, one or more of the semiconductor die 242, 244, and/or 246 can instead be a module (e.g., a discrete module, a packaged module).

In this implementation, a surface plating layer 256 is disposed along the plane B1. Portions of the surface plating layer 256 (which can be referred to as surface plating layer portions) are disposed between the interconnection components 250 (e.g., ends of the interconnection components 250) and an external block 290. Also, portions of the surface plating layer 256 are disposed between the semiconductor die 244 and the external block 290. In some implementations, portions of the surface plating layer 256 can function as an interface or coupling conductor between the interconnection components 250 and/or the semiconductor die 244 and the external block 290. In this example implementation, the surface plating layer 256 is insulated from the semiconductor die 242 by the molding layer 240.

In this implementation, the interconnection components 250 include at least interconnection components 250A through 250F. Portions of the redistribution layer 252, conductive pillars 254, surface plating layer 256, and/or so forth associated with each of the interconnection components 250 can generally be labeled with the identifiers A through F. For example, interconnection component 250C includes a redistribution layer portion 252C that is coupled to the substrate 230 and also includes a conductive pillar 254C coupled to the redistribution layer portion 252C. Accordingly, the conductive pillar 254C is disposed between the substrate 230 and the redistribution layer portion 252C.

As shown in FIG. 2A, the redistribution layer 252 has a vertical dimension B3 (along the vertical direction), and the conductive pillars 254 have a vertical dimension B4 (along the vertical direction). In this implementation, the vertical dimension B3 of the redistribution layer 252 is less than (e.g., thinner) than the vertical dimension B4 of one or more of the conductive pillars 254. In some implementations, the vertical dimension B3 of the redistribution layer 252 can be equal to, or greater than (e.g., thicker than), the vertical dimension B4 of one or more of the conductive pillars 254. In some implementations, the vertical dimensions can also be referred to as heights or thicknesses. In some implementations, one or more of the conductive pillars 254 can be referred to as functioning as an electrical interconnect between the external block 290 and the redistribution layer 252.

The interconnection components 250 can have a variety of configurations and functions. For example, the interconnection component 250A includes a redistribution layer portion 252A coupled to a pair of conductive pillars 254A-1 and 254A-2. The redistribution layer portion 252A has a lateral dimension (which can be measured along the direction A2 and can generally be referred to as a horizontal dimension, a width or a length) that is greater than a lateral dimension (which can be measured along the direction A2) of each of the conductive pillars 254A-1 and 254A-2. In this implementation, the lateral dimension of the redistribution layer portion 252A and the lateral dimension of each of the conductive pillars 254A-1 and 254A-2 can be substantially uniform (e.g., constant) along the vertical direction A1. In some implementations, a lateral dimension along direction A3 of the redistribution layer portion 252A can be different than a lateral dimension along direction A3 of one or more of the conductive pillars 254A-1 and 254A-2.

The interconnection component 250A extends between the plane B1 and the plane B2, so that the interconnection component 250A has a first end directly coupled to the substrate 230 and a second end directly coupled to the surface plating layer 256. As shown in FIG. 2A, several of the interconnection components 250 extend between the plane B1 and the plane B2, so that the interconnection components 250 have first ends directly coupled to the substrate 230 and second ends directly coupled to the surface plating layer 256.

As another example, the interconnection component 250B includes a redistribution layer portion 252B coupled to a conductive pillar 254B. In this interconnection component 250B, the lateral dimension of the redistribution layer portion 252B is approximately equal to a lateral dimension of the conductive pillar 254B. Accordingly, the interconnection component 250B has a substantially uniform (e.g., constant) lateral dimension along the vertical direction A1. In some implementations, the lateral dimension of the interconnection component 250B can vary (e.g., taper) along the vertical direction from plane B1 to plane B2, or vice versa.

As another example, the interconnection component 250C includes a redistribution layer portion 252C coupled to a conductive pillar 254C. In this interconnection component 250C, the lateral dimension (e.g., width) of the redistribution layer portion 252C (or a portion thereof) is greater than a lateral dimension of the conductive pillar 254C.

As shown in FIG. 2A, the interconnection component 250D includes a redistribution layer portion 252D. The interconnection component 250D is directly coupled to the semiconductor die 246. Specifically, the interconnection component 250D can be coupled to one or more conductors included in the semiconductor die 246. In this embodiment, multiple interconnection components, in addition to interconnection component 250D, are coupled to the semiconductor die 246 (e.g., disposed between the semiconductor die 246 and the substrate 230).

Interconnection component 250E includes a redistribution layer portion 252E and a conductive pillar 254E. The conductive pillar 254E is coupled to a surface plating layer portion 256E. As shown in FIG. 2A, in addition to being coupled to the interconnection component 250E, the surface plating layer portion 256E is coupled to a bottom surface of the semiconductor die 244 (e.g., a bottom portion of the semiconductor die 244). In some implementations, the bottom surface of the semiconductor die 244 coupled to the surface plating layer portion 256E can be associated with a drain portion of a vertical semiconductor device (e.g., a vertical MOSFET device) included in the semiconductor die 244. Accordingly, the interconnection component 250E can be electrically coupled to the drain portion (or contact) of the vertical semiconductor device via the surface plating layer portion 256E. A source portion (or contact) of the vertical semiconductor device can be disposed on an opposite side (e.g., a top surface) of the semiconductor die 244.

Interconnection component 250F includes a redistribution layer portion 252F and a conductive pillar 254F. As shown in FIG. 2A, in addition to being coupled to the interconnection component 250E, the redistribution layer portion 252F is coupled to a top surface of the semiconductor die 242. In some implementations, the redistribution layer portion 252F can be electrically coupled to a semiconductor device (e.g., a laterally-oriented semiconductor device such as a lateral-type MOSFET device) included in the semiconductor die 242. In this implementation, the external block 290 (or a portion thereof) can be electrically coupled via the interconnection component 250F to the top surface of the semiconductor die 242 opposite a bottom surface of the semiconductor die 242, which is facing the external block 290.

In some implementations, the redistribution layer 252, the conductive pillars 254, and/or the surface plating layer 256 can be formed of a metal such as titanium, copper, aluminum, and/or so forth. In some implementations, the conductive pillars 254 can include, or can be formed using, for example, nano-particle copper bonding. In some implementations, the redistribution layer 252 and/or one or more of the conductive pillars 254 can be formed using, for example, an electroplating process. The surface plating layer 256, similarly, can be formed of a metal and can be formed using an electroplating process. In some implementations, the surface plating layer 256 can be formed using, for example, a sputtering process (e.g., a titanium/copper sputtering process).

As shown in FIG. 2A, the interconnection components 250 are formed using two layers of conductors—the redistribution layer 252 and the conductive pillars 254. In some implementations, one or more of the interconnection components 250 can be formed using more than two layers of conductors. For example, an interconnection component can include a redistribution layer, a first conductive pillar layer coupled to the redistribution layer, and a second conductive pillar layer coupled to the first conductive pillar layer so that the first conductive pillar layers are disposed between the redistribution layer and the second conductive pillar layer.

Figure 2B:
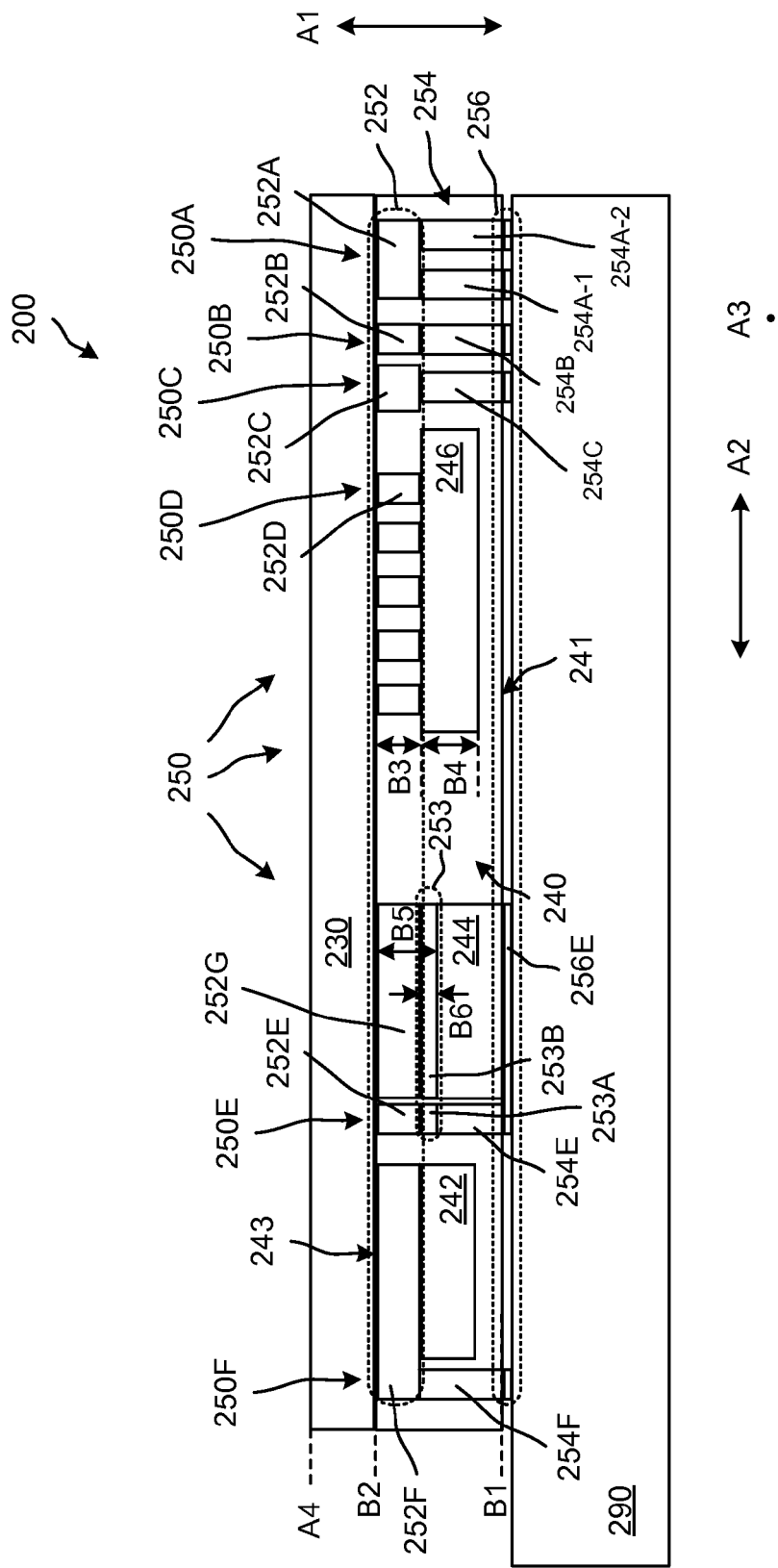
FIG. 2B is side cross-sectional view of a variation of the device shown in FIG. 2A, or a portion thereof, according to an implementation.

FIG. 2B is a side cross-sectional view of variation of the device 200 shown in FIG. 2A, or a portion thereof. In this implementation, the redistribution layer 252 is a first redistribution layer 252 and the device 200 includes a second redistribution layer 253. Portions of the first redistribution layer 252 can be referred to as first redistribution layer portions (e.g., first redistribution layer portion 252G) and portions of the second redistribution layer 252 can similarly be referred to as second redistribution layer portions. In this implementation, the second redistribution layer 253 includes a second redistribution layer portion 253A and a second redistribution layer portion 253B. In some implementations, the second redistribution layer portion 253A can be a first portion 253A of the second redistribution layer 253 and the second redistribution layer portion 253B can be a second portion 253B of the second redistribution layer 253.

The second redistribution layer 253 can have a surface area (e.g., footprint or outer profile when view in a plan view or along direction A1) that is different than (e.g., smaller than, greater than) a surface area (e.g., footprint or outer profile when view in a plan view or along direction A1) of the first redistribution layer 252. In some implementations, the second redistribution layer 253 can have a surface area (or footprint) that is equal to or the same as a surface area (or footprint) of the first redistribution layer 252. In some implementations, the second redistribution layer 253 can have a pattern that is different (e.g., higher density, offset in some dimensions, lower density, different shapes) than a pattern of the first redistribution layer 252. In some implementations, the second redistribution layer 253 can have a pattern that is equal to or the same as a pattern of the first redistribution layer 252.

As shown in FIG. 2B, the second redistribution layer portion 253B is disposed between the first redistribution layer 252 and the semiconductor die 244. In this implementation, the second redistribution layer portion 253A is disposed between the first redistribution layer portion 252E and the conductive pillar 254E. Accordingly, the second redistribution layer 253 (or a portion thereof) is disposed between the first redistribution layer 252 and the conductive pillars 254.

In this implementation, the second redistribution layer portion 253B is associated with specific elements of the device 200. Specifically, the second redistribution layer portion 253B is associated with the semiconductor die 244 and with the first redistribution layer portion 252G. The second redistribution layer portion 253A, similarly, is associated with specific elements of the device 200. Specifically, the second redistribution layer portion 253A is associated with the conductive pillar 254E and the first redistribution layer portion 252E.

In some implementations, the second redistribution layer 253, or a portion thereof, can be associated with more than one or two elements (e.g., a die and a conductive pillar). In some implementations, multiple portions of the second redistribution layer 253 can be associated with a single element (e.g., a die, a module, a pillar).

As shown in FIG. 2B, the first redistribution layer portion 252E, the second redistribution layer portion 253A, and the conductive pillar 254E (and the surface plating layer portion 256E) define a stack (e.g., a vertical stack). In contrast, the first redistribution layer portion 252F and the conductive pillar 254F define a stack (e.g., a vertical stack) without an intervening second redistribution layer, or portion thereof.

In this implementation, the first redistribution layer 252 and the second redistribution layer portion 253B can have a vertical dimension B5 (or thickness) that is greater than the vertical dimension B3 of the first redistribution layer 252 alone. In some implementations, a vertical dimension of one portion of the first redistribution layer 252 can be different than a vertical dimension of another portion of the first redistribution layer 252. Accordingly, although not shown, in some implementations, the vertical dimension B3 of, for example, the redistribution layer portion 252D can be equal to or greater than the vertical dimension B5 of the combination of the redistribution layer portion 252F and the second redistribution layer portion 253B.

In some implementations, rather than being constant or uniform, the second redistribution layer 253 can have a first portion with a vertical dimension different than (e.g., less than, greater than) a second portion of the second redistribution layer 253. For example, the second redistribution layer portion 253A can have a vertical dimension different than a vertical dimension of the second redistribution layer portion 253B.

In this implementation, a vertical dimension B6 of the second redistribution layer 253 is less than the vertical dimension B3 of the first redistribution layer 252. In some implementations, the vertical dimension B6 of the second redistribution layer 253 can be greater than or equal to the vertical dimension B3 of the first redistribution layer 252.

In some implementations, a vertical dimension of a redistribution layer can be defined so that a distance between a surface of an element with respect to the substrate 230 can be defined. For example, the vertical dimension B6 of the redistribution layer 253 can be defined so that the combined vertical dimension B5 results in a surface (e.g., a bottom surface, a top surface) of semiconductor die 244 being a specified distance from the substrate 230. Accordingly, the vertical dimension B6 of the redistribution layer 253 can be defined so that the combined vertical dimension B5 results in the surface of semiconductor die 244 being farther from the substrate 230 or closer to the external block 290.

In some implementations, vertical dimensions (or thicknesses) of multiple redistribution layers can be defined so that a first distance between a surface of a first element with respect to the substrate 230 can be defined relative to a second distance between a surface of a second element with respect to the substrate 230. For example, as shown in FIG. 2B, a stack including the first distribution layer portion 252G, the second distribution layer portion 253B and the semiconductor die 244 can have a vertical dimension (or thickness) (not labeled) that is greater than a vertical dimension (not labeled) of a stack including the first distribution layer portion 252F and the semiconductor die 242. Accordingly, a bottom surface of the semiconductor die 244 can be farther from the substrate 230 (and the semiconductor die 244 can be thinner) than would be possible without the second distribution layer portion 253B.

Although not shown, in some implementations a second redistribution layer can be defined (e.g., between first redistribution layer 252 and semiconductor die 242) so that a distance between the bottom surface of the semiconductor die 242 and the substrate 230 can be closer to a distance between a bottom surface of the semiconductor die 244 and the substrate 230 than without the second distribution layer 253 (or portion thereof). This can be achieved despite differences in vertical dimensions (or thicknesses) of the semiconductor die 242 and the semiconductor die 244. In some implementations, use of the second redistribution layer 253 can enable differences in vertical dimensions (or thicknesses) of the semiconductor die 242 and the semiconductor die 244 (or other components). This manipulation of distances can facilitate the packaging process and encapsulation or at least partial covering (or around) using, for example, the molding layer 240.

In some implementations, a vertical dimension of a redistribution layer can be defined so that a thickness of an element (with respect to another element) can be defined. For example, the vertical dimension or thickness of semiconductor die 244 can be defined so that the vertical dimension or thickness of semiconductor die 244 shown in FIG. 2B can be less than the vertical dimension or thickness of semiconductor die 244 shown in FIG. 2A. Also, the use of the second redistribution layer 253 can enable a decrease in the thickness of the semiconductor die 244 shown in FIG. 2B with the semiconductor die 244 still being in contact with (or exposed to) the surface plating layer 256. This can be achieved with the overall thickness of the device 200 remaining unchanged, and with the surface of the semiconductor die 244 being plated with the surface plating layer 256. In other words, the second redistribution 253 can function as a spacer that can compensate for (or allow for) a thinner semiconductor die 244 (which can be a discrete device such as a MOSFET device). The thinner semiconductor die 244 may be desirable for performance purposes of the semiconductor die 244. In some implementations, the vertical dimension or thickness of semiconductor die 244 can be less than or equal to the vertical dimension or thickness of semiconductor die 242 (which is buried in this implementation). In some implementations, the vertical dimension or thickness of semiconductor die 244 can be greater than the vertical dimension or thickness of semiconductor die 242.

Although not shown in FIG. 2B, more than two redistribution layers can be included in the device 200. Two or more of the more than two redistribution layers can have the same or different vertical dimensions or thicknesses.

Figure 2C:
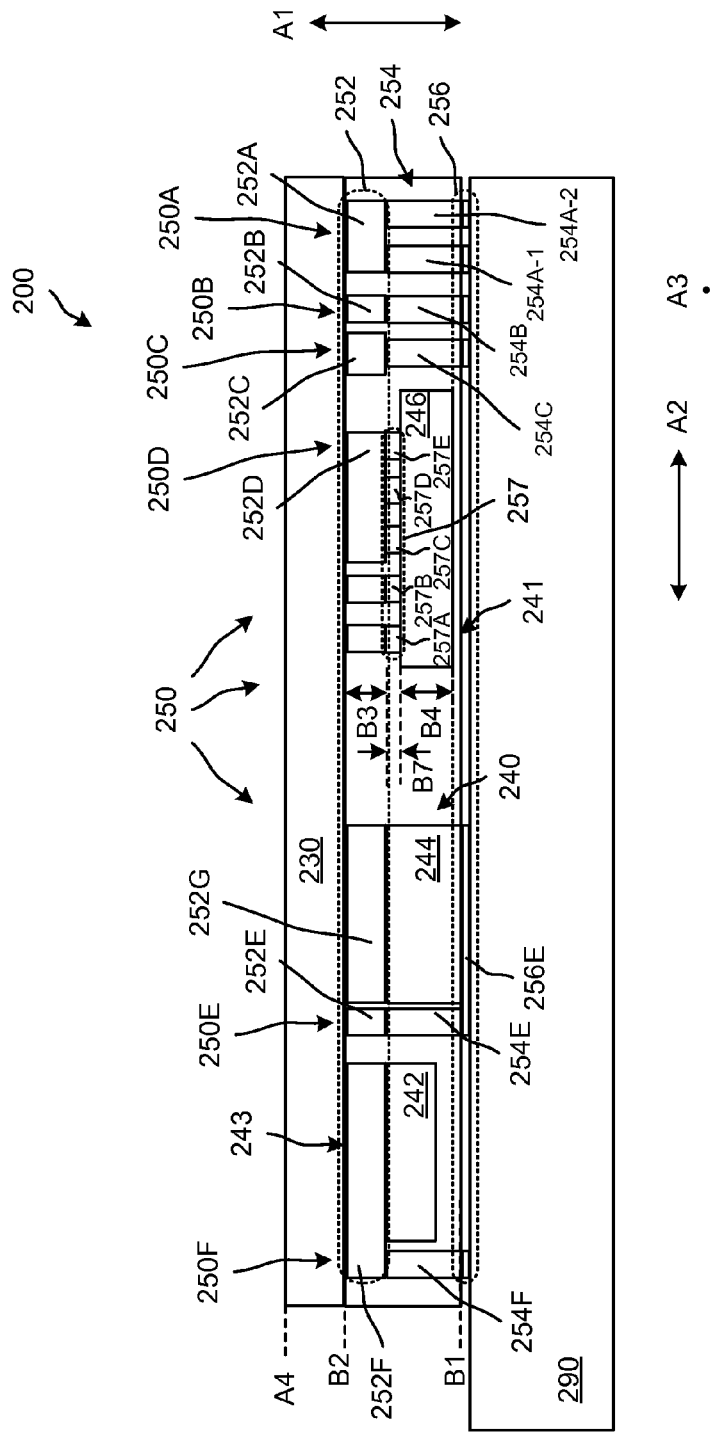
FIG. 2C is side cross-sectional view of another variation of the device shown in FIG. 2A, or a portion thereof, according to an implementation.

FIG. 2C is side cross-sectional view of another variation of the device 200 shown in FIG. 2A, or a portion thereof, according to an implementation. As shown in FIG. 2C, the redistribution layer 252 is a first redistribution layer 252 and the device 200 includes a second redistribution layer 257. Portions of the first redistribution layer 252 can be referred to as first redistribution layer portions (e.g., first redistribution layer portion 252F) and portions of the second redistribution layer 257 can similarly be referred to as second redistribution layer portions. In this implementation, the second redistribution layer 257 includes second redistribution layer portions 257A through 257E.

In this variation of the device 200, the first redistribution layer portions 257C through 257E are coupled to the second redistribution layer portion 252D. Accordingly, a width (or lateral dimension (e.g., lateral cross-sectional dimension)) of each of the second redistribution layer portions 257C through 257E is less than a width of the first redistribution layer portion 252D. The first redistribution layer portions 257A through 257E can be configured to match or correspond with a contact pattern of the semiconductor die 246.

The second redistribution layer 257 can be defined to facilitate coupling of (e.g., bonding of) the semiconductor die 246 within the device 200. For example, the aspect ratio (or dimensions) of the portions 257A through 257E can be configured to facilitate soldering (through surface tension of the solder) of the semiconductor die 246 to the second redistribution layer 257. In some implementations, relatively small aspect ratios (or dimensions) of the second distribution layer portions 257A through 257E can enable soldering without shorting between the portions 257A through 257E. The first redistribution layer 252 can have dimensions that can facilitate current flow or current conduction (e.g., low resistance) given that the dimensions of the second redistribution layer portions 257A through 257E can be relatively small (and resistive).

In addition, the vertical dimension B3 (or thickness) of the first redistribution layer 252 can be greater than a vertical dimension B7 (or thickness) of the second redistribution layer 257. The vertical dimension B3 of the first redistribution layer 252 can be greater than the vertical dimension B7 of the second redistribution layer 257 to facilitate current flow (e.g., low resistance) relative to the second redistribution layer 257. In some implementations, the vertical dimension B3 of the first redistribution layer 252 can be less than or equal to the vertical dimension B7 of the second redistribution layer 257.

The second redistribution layer 257 can be defined to eliminate wafer level processing associated with the semiconductor die 246. For example, in some implementations, the semiconductor die 246, during wafer level processing, can include multiple different layers including, for example, solder and conductive pillars. Forming the second redistribution layer 257 on the first redistribution layer 252 can eliminate (or reduce) the need to form one or more of the multiple different layers at the wafer level including, for example, the conductive pillars. In some implementations, the features illustrated in FIG. 2B can be combined with the features included in FIG. 2C.

In some implementations the vertical dimension B3 and/or the vertical dimension B7 can be relatively thin to accommodate a relatively thick semiconductor die. For example, the vertical dimension B3 of the first redistribution layer 252 and/or the vertical dimension B7 of the second redistribution layer 254 can be relatively thin so that the semiconductor die 246 can be thicker than shown in, for example, FIGS. 2A through 2C.

Figure 3A:
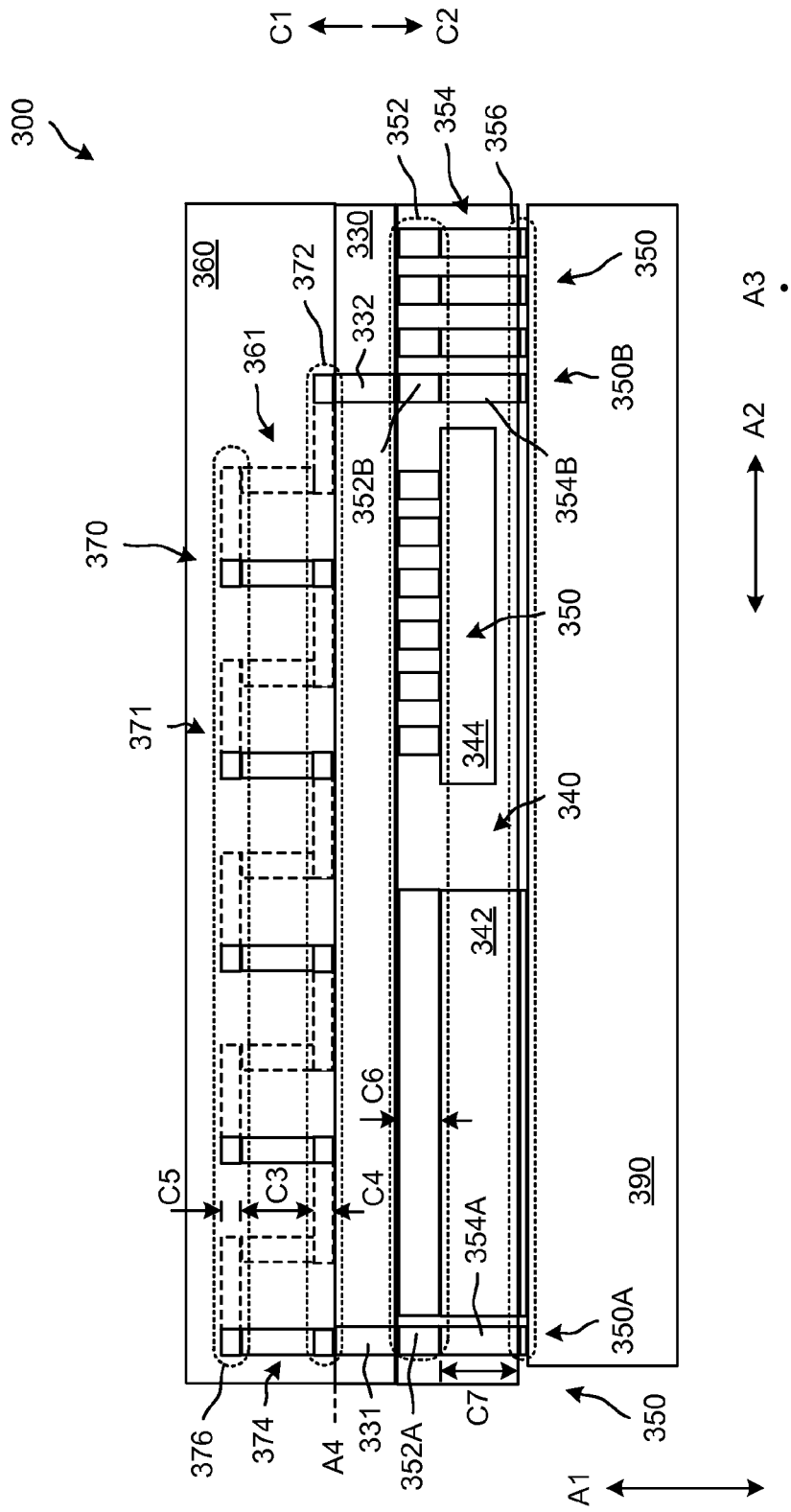
FIG. 3A is a side cross-sectional view of another device, or a portion thereof, according to an implementation.

FIG. 3A is a side cross-sectional view of another device 300, or a portion thereof, according to an implementation. As shown in FIG. 3A, the device 300 includes an inductive component 370 disposed within a molding layer 360 on side C1 (e.g., a first side) of a substrate 330. Interconnection components 350 and semiconductor die 342, 344 are disposed within a molding layer 340 on side C2 (e.g., a second side) of the substrate 330 of the device 300. Accordingly, the device 300 includes magnetic integration on side C1 of the substrate 330 and interconnection integration on side C2 of the substrate 330. In some implementations, interconnection integration can be excluded so that a stand-alone inductive component can be formed using magnetic integration.

The use of magnetic integration within the device 300 can reduce the overall size and complexity of the device 300 in a desirable fashion. In some power conversion circuits, for example, the use of inductive components (e.g., magnetic components) such as inductors and transformers is relatively common. However, by providing in-package magnetics integrated within the device 300 as described herein, the overall solution size is reduced while performance, cost and complexity can all be improved in a desirable fashion.

Several of the interconnection components 350 in the device 300 are defined by portions of a redistribution layer 352 (which can be referred to as redistribution layer portions) and conductive pillars 354. One or more portions of the interconnection components 350 can be included within an interconnection region (e.g., interconnection region 145 shown in FIG. 1). In FIG. 3A, a surface plating layer 356 is disposed between the device 300 and an external block 390.

The inductive component 370 can include several layers of conductors embedded within the molding layer 360. Specifically, the inductive component 370 can include a bottom redistribution layer 372, conductive pillars 374 (which can be referred to as a conductive pillar layer), and a top redistribution layer 376. Accordingly, the conductive pillars 374 can be disposed between the bottom redistribution layer 372 and the top redistribution layer 376. The bottom redistribution layer 372, the conductive pillars 374, and the top redistribution layer 376 can collectively define a winding 371 of the inductive component 370. Portions of the winding 371 of the inductive component 370 that are out of plane of the cross-sectional plane of the device 300 are shown in this embodiment with dashed lines.

At least a portion 361 of the molding layer 360 can include a magnetic substance that functions as a magnetic core of the inductive component 370. In some implementations, the portion 361 of the molding layer 360 that functions as a magnetic core can be referred to as a magnetic core portion. Thus, the winding 371 defined by the inductive component 370 can be disposed around the magnetic core portion of the molding layer 360.

The magnetic substance included in the portion 361 of the molding layer 360 (which functions as a magnetic core) can include, for example, a ferromagnetic material, a magnetized nano-particle material, a metal (e.g., Iron, Zinc, Cobalt, Manganese), and/or so forth. In some implementations, the magnetic substance can be embedded within (e.g., suspended within) the molding layer 360. In some implementations, if using a nano-particle material, the nano-particles can be coated in an insulating material, such as carbon, so that each of the nano-particles can be substantially isolated from other nano-particles. In some implementations, the nano-particles can have a size (e.g., an average size, a target size) between approximately 10 nanometers (nm) to 100 nm (e.g., 40 nm, 50 nm, 75 nm). In some implementations, the nano-particles can have a size (e.g., an average size, a target size) less than 10 nm and/or greater than 100 nm.

Nano-particles can be used to form a relatively efficient magnetic core. In some implementations, nano-particles used as a magnetic core can have advantages over, for example, conventional ferrite materials in terms of energy density. This can result in a relatively large inductance in a small volume through the use of relatively high number of turns within the winding 371. The winding 371 can incorporate a relatively high number of turns with relatively low impedance, which can result in a relatively efficient inductor and/or transformer.

In some implementations, the portion 361 of the molding layer 360 can be formed using sputtering techniques, deposition techniques, molding techniques, vaporized substances, liquid mixtures that include nanoparticles, and/or so forth. In some implementations, magnetic forces can be used to separate substances (e.g., magnetic substances or mixtures) that are used to form the portion 361 of the molding layer 360.

In some implementations, a magnetic substance can be formed into nano-particles in a deposition chamber, such as a sputtering chamber. In some implementations, nano-particles can be the starting structural basis of a magnetic substance used to form the portion 361 of the molding layer 360.

In some implementations, the portion 361 of the molding layer 360 can include a variety of concentrations of magnetic substances (e.g., nano-particles). For example, the portion 361 of the molding layer 360 can include a magnetic substance with a concentration (e.g., a graded concentration) that varies with depth (along the vertical direction A1) or along a horizontal direction (along the horizontal directions A2 and/or A3). In some implementations, a concentration of magnetic substance within the portion 361 can be greater than or equal to 50% (e.g., 60%, 75%, 90%, 99%, 100%) in some implementations, the concentration of nano-particles within the portion 361 of the molding layer 360 can be less than 50%.

In some implementations, the portion 361 of the molding layer 360 can include multiple layers (e.g., sub layers) of materials. For example, the portion 361 can include alternating layers (or interleaved layers) of magnetic material (e.g., a material including a magnetic substance) and non-magnetic material (e.g., an isolation layer). In some implementations, eddy currents that can be created during formation can be substantially reduced by forming the portion 361 of the molding layer 360 incrementally in layers with an isolation layer between magnetic layers.

As mentioned above, the molding layer 360 can include multiple layers (or sub-layers) of molding or multiple portions of molding layer 360. For example, the bottom redistribution layer 372 can be disposed within a first portion (or first sub-layer) of the molding layer 360, the conductive pillars 374 can be disposed in a second portion (or second sub-layer) of the molding layer 360, and the top redistribution layer 376 can be disposed in a third portion (or third sub-layer) of the molding layer 360. In some implementations, the first portion, the second portion, and/or the third portion of the molding layer 360 can be made of the same material. In some implementations, one or more of the first portion, the second portion, or the third portion of the molding layer 360 can be made of different materials. In some implementations, one or more of the first portion, the second portion, or the third portion of the molding layer 360 can be formed using different processes and/or using different processing steps.

For example, the first portion of the molding layer 360 can be formed of a material that excludes a magnetic substance during a first processing step, and the second portion of molding layer 360 can be formed of a material including a magnetic substance during a second processing step (subsequent to the first processing step). The third portion of the molding layer 360 can be formed of the same material of the first portion or the second portion during a third processing step. In some implementations, the third portion of the molding layer 360 can be formed of a different material than is used for the first portion and/or the second portion.

In some implementations, first, second, and third portions of the molding layer 360 can be formed in a serial fashion. For example, the first portion of the molding layer 360 can be formed in conjunction with the formation of the bottom redistribution layer 372, the second portion of the molding layer 360 can be formed in conjunction with the formation of the conductive pillars 374, and the third portion of the molding layer 360 can be formed in conjunction with the formation of the top redistribution layer 376. More details related to formation of an inductive component are discussed below.

Figure 3B:
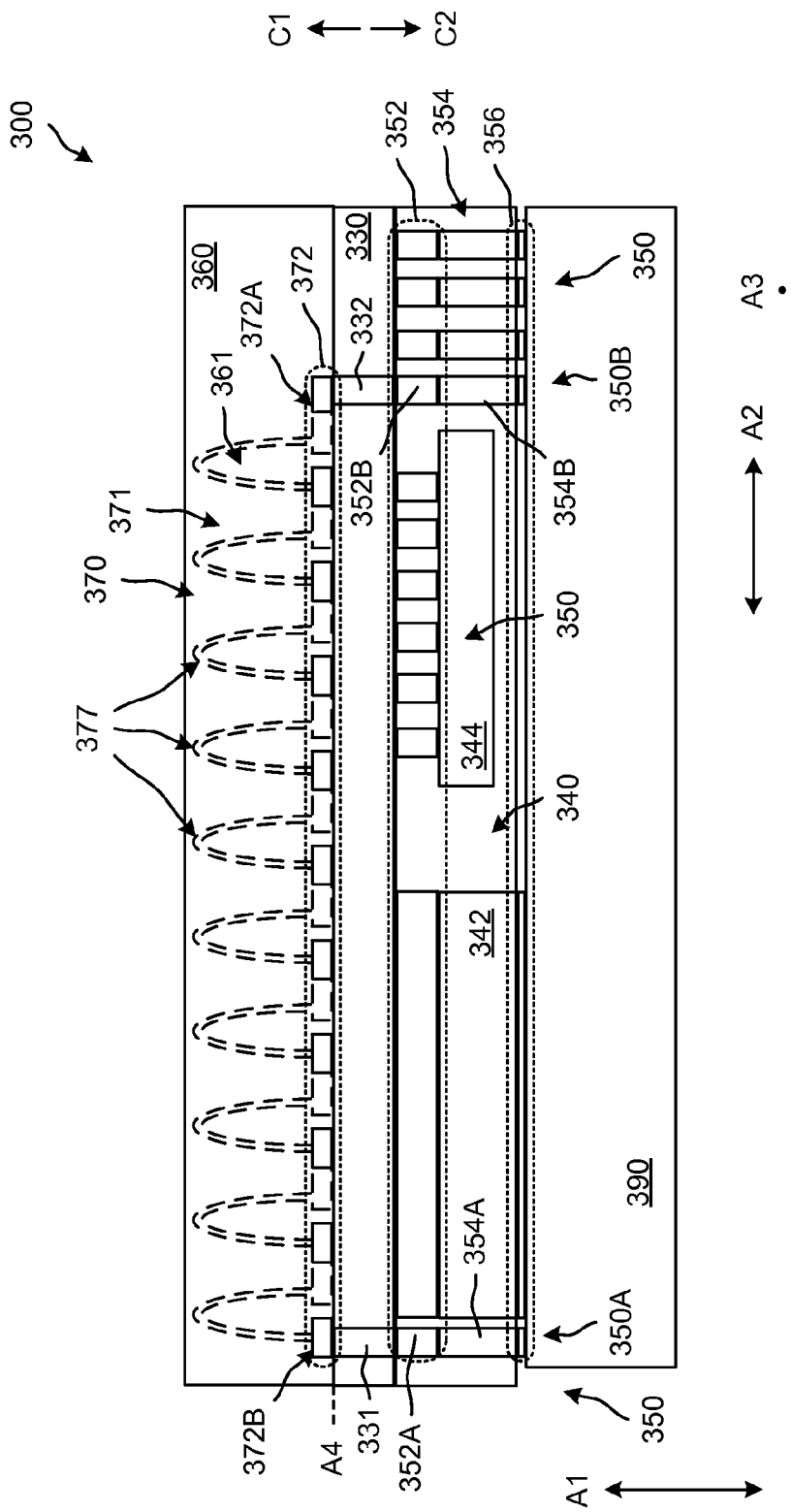
FIG. 3B is a side cross-sectional view of a variation of the device shown in FIG. 3A, or a portion thereof, according to an implementation.
Figure 4A:
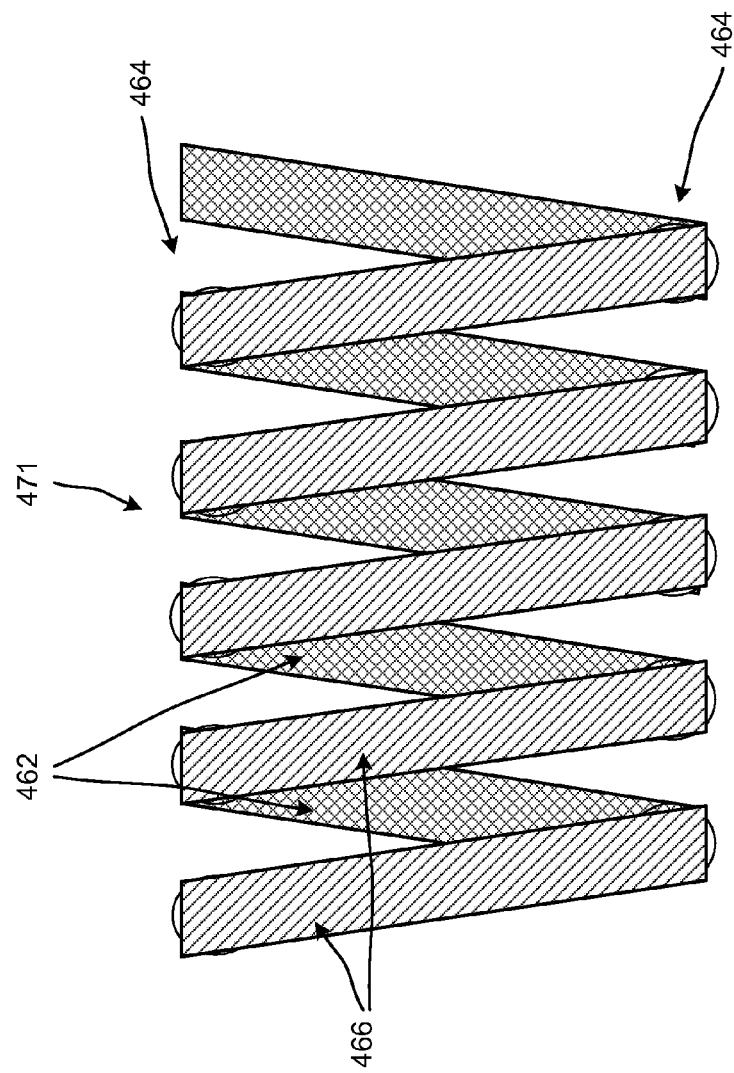
FIG. 4A is a top view of conductors within a winding of an inductive component.

FIG. 4A is a top view of conductors within a winding 471 of an inductive component. The winding 471 is illustrated without a molding layer disposed around the winding 471 so that the conductors included in the winding 471 can be readily illustrated. The winding 471 shown in FIG. 4A can be similar to the winding 371 shown in FIG. 3A or FIG. 3B. As shown in FIG. 4A, the winding 471 includes conductors included within a bottom redistribution layer 462 (shown with cross-hatched lines), conductive pillars 464, and conductors included within a top redistribution layer 466 (shown with slanted lines).

A variety of configurations of windings can be formed within an inductive component different than that shown in FIG. 4A. For example, a winding can be formed using conductors within a redistribution layer having one or more right angles, one or more curved portions, and/or so forth. In some implementations, windings can have a spiral shape or a helical shape along a vertical axis (e.g., along direction A1 shown in FIG. 3A or FIG. 3B) and/or lateral axis (along direction A2 or A3 as shown in FIG. 3A or FIG. 3B).

Referring back to FIG. 3A, in some implementations, the portion 361 of the molding layer 360 can have an overall lateral dimension (along direction A2 and/or A3) that is greater than a lateral dimension (along direction A2 and/or A3) of the winding 371. In some implementations, the portion 361 of molding layer 360 can have a lateral dimension (along direction A2 and/or A3) that is less than or equal to a lateral dimension (along direction A2 and/or A3) of the winding 371. In implementations where the portion 361 extends beyond the winding 371 in lateral dimension, a magnetic loop can be closed and flux lines can be maintained within the portion 361, which can be desirable.

Although not shown in FIG. 3A, in some implementations, more than one winding (similar to winding 371) can be formed within the molding layer 360. In some implementations, the multiple windings can be electrically coupled to each other. In some implementations, the windings can be magnetically coupled (e.g., via a magnetic flux) to form, for example, a transformer. The windings can be placed adjacent to one another around adjacent magnetic core portions such that flux lines respectively associated with the windings can pass through one another while being relatively electrically isolated. In some implementations, the windings can be insulated both electrically and magnetically from one another. Although not shown, in some implementations, electrical isolation between windings can be achieved by disposing a first winding (and magnetic core) on side C1 of the substrate 330 and a second winding (and magnetic core) on side C2 of the substrate 330. Accordingly, flux lines from, for example, the first winding can pass through the substrate 330 and can pass through the second winding (and magnetic core).

In some implementations, multiple windings can be formed so that at least some portions of the windings are lateral to one another within the same horizontal plane (e.g., plane A4). In some implementations, multiple windings can be formed vertically on top of one another so that the multiple windings are vertically stacked along vertical direction A1.

In this implementation shown in FIG. 3A, the winding 371 is electrically coupled to the interconnection component 350A and the interconnection component 350B through substrate via 331 and substrate via 332 (also can be referred to as conductive vias). The substrate vias 331, 332 are formed through the substrate 330. The substrate via 331 and the substrate via 332 can include a conductive material such as a metal. In this implementation, the winding 371 is electrically coupled using the interconnection components 350A, 350B and the substrate vias 331, 332 to the external block 390. In some implementations, the winding 371 can be electrically coupled to one or more components included in the molding layer 340 and/or the molding layer 360. For example, in some implementations, the winding 371 can be electrically coupled to one or more semiconductor die included in the molding layer 340 and/or the molding layer 360.

The conductive pillars 374 can have a vertical dimension C3 (along the vertical direction A1), which can be referred to as a thickness or height, that is greater than a vertical dimension C4 of the bottom redistribution layer 372 and greater than a vertical dimension C5 of the top redistribution layer 376. In some implementations, the vertical dimension C3 can be equal to or less than the vertical dimension C4 and/or equal to or less than the vertical dimension C5. The vertical dimension C4 of the bottom redistribution layer 372 and/or the vertical dimension C5 of the top redistribution layer 376 can be the same as or different than (e.g., greater than, less than) a vertical dimension C6 of the redistribution layer 352. The vertical dimension C3 of the conductive pillars 374 can be the same as or different than (e.g., greater than, less than) a vertical dimension C7 of the conductive pillars 354.

In some implementations, if the device 300 includes multiple windings, two or more of the multiple windings can have the same or different numbers of turns. For example, a first winding can have a first number of turns, and a second winding can have a second number of turns different than the first number of turns. Also, two or more of the multiple windings can have the same or different dimensions (e.g., heights (overall heights), lateral dimensions (overall lateral dimensions), lengths (overall lengths), conductor cross-sectional sizes, core sizes (or volumes), etc.).

In some implementations, the bottom redistribution layer 372, the conductive pillars 374, and/or the top redistribution layer 376 can be formed of a metal such as copper, aluminum, and/or so forth. In some implementations, the bottom redistribution layer 372, the conductive pillars 374, and/or the top redistribution layer 376 can be formed using, for example, an electroplating process.

As shown in FIG. 3A, the winding 371 is formed using three layers of conductors—the bottom redistribution layer 372, the conductive pillars 374, and the top redistribution layer 376. In some implementations, one or more windings (e.g., winding 371) can be formed using more than three layers of conductors. In some implementations, if the device 300 includes multiple windings, two or more of the multiple windings can include the same or different layers of conductors (also can be referred to as conductor layers).

In some implementations, one or more of the semiconductor die 342, 344 can be a module (e.g., a discrete device module, a packaged device module). Accordingly, the module can be bonded to (e.g., coupled to) the redistribution layer 352).

FIG. 3B is a side cross-sectional view of a variation of the device 300 shown in FIG. 3A, or a portion thereof, according to an implementation. Elements of the inductive component 370 that are out cross-sectional plane are illustrated with dashed lines.

In this implementation, the inductive component 370 is modified from that shown in FIG. 3A. Rather than being formed using the conductive pillars 374 and top redistribution layer 376, the inductive component 370 is formed using several wires 377. As shown in FIG. 3B, the redistribution layer 372 (which is referred to as the bottom redistribution layer when discussed in connection with the implementation shown in FIG. 3A) defines, or includes, pads 372A, 372B to which at least some of the wire 377 can be coupled (e.g., bonded, soldered). Accordingly, the wires 377 and the redistribution layer 372 collectively define a winding 371 of an inductive component 370.

In some implementations, the wires 377 can be, for example, bond wires, coiled wires, copper clips, and/or so forth. In some implementations, one or more of the wires 377 can define one or more loops. In some implementations, one or more of the wires 377 can have a different shape than shown in FIG. 3B. In some implementations, one of the wires 377 can have a different shape or cross-sectional than another of the wires 377 shown in FIG. 3B.

In some implementations, more pads or less pads than shown in FIG. 3B, can be included in the redistribution layer 372. In some implementations, the pads 372A, 372B can have the same or different surface area (e.g., footprint, outer profile) and/or volume. In some implementations, one or more additional redistribution layers (not shown) can be stacked on (e.g., vertically stacked on) one or more portions of the redistribution layer 372.

In some implementations, a different passive element (e.g., a resistive element) can be included in the device 300 instead of (or in conjunction with) the inductive component 370. In such implementations, the different passive element can be formed using a variety of materials such as wires, copper clips, bonding materials, polysilicon, and/or so forth.

Figure 4B:
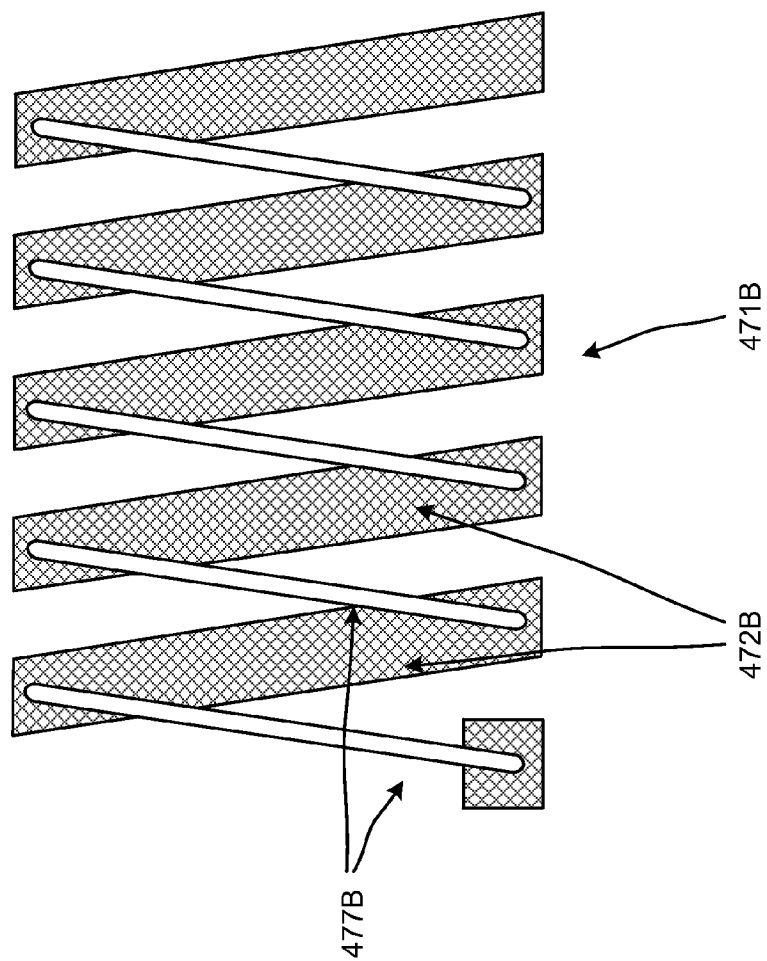
FIG. 4B is a top view of conductors within another winding of an inductive component.

FIG. 4B is a top view of conductors within a winding 471B of an inductive component. The winding 471B is illustrated without a molding layer disposed around the winding 471B so that the conductors included in the winding 471B can be readily illustrated. The winding 471B shown in FIG. 4B can be similar to the windings 371 shown in FIG. 3A or FIG. 3B. As shown in FIG. 4B, the winding 471B includes conductors included within a redistribution layer 472B (e.g., bottom redistribution layer) (shown with cross-hatched lines) and wires 477B (e.g., wire conductors) (shown with slanted lines).

A variety of configurations of windings can be formed within an inductive component different than that shown in FIG. 4B. For example, a winding can be formed using conductors within a redistribution layer having one or more right angles, one or more curved portions, and/or so forth. In some implementations, the wires 477B can have multiple spiral shapes and/or a helical shape along a vertical axis and/or lateral axis.

Figure 3C:
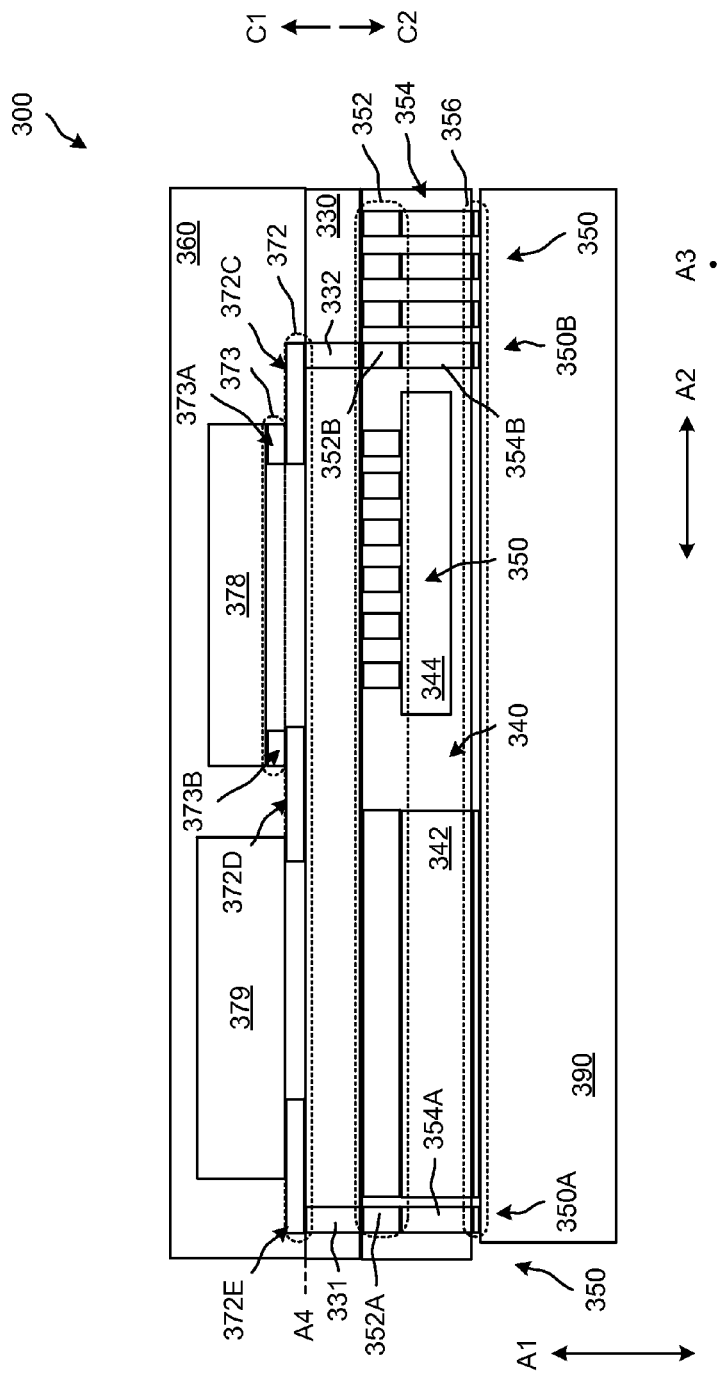
FIG. 3C is a side cross-sectional view of another variation of the device shown in FIG. 3A, or a portion thereof, according to an implementation.

FIG. 3C is a side cross-sectional view of another variation of the device shown in FIG. 3A, or a portion thereof, according to an implementation. In this implementation, a first chip 378 (also can be referred to as a first module) and a second chip 379 (also can be referred to as a second module) are included on side C1 of the device 300. The first chip 378 is coupled to (e.g., bonded to) redistribution layer 373 and the second chip is coupled to (e.g., bonded to) redistribution layer 372. The redistribution layer 372 includes pad 372C, pad 372D, and pad 372E. The redistribution layer 373 includes pad 373A and pad 373B. The redistribution layer 373 is disposed on redistribution layer 372 such that the redistribution layer 372 is disposed between the redistribution layer 373 and the substrate 330. The pad 373A is disposed on (or coupled to) the pad 372C, and the pad 373B is coupled to the pad 372D.

In this implementation, the first chip 378 has a thickness that is less than a thickness of the second chip 379. In some implementations, the thickness of the first chip 378 can be the same as the thickness of the second chip 379. In some implementations, a size of the first chip 378 can be different than, or the same as, a size of the second ship 379. In some implementations, the molding layer 360 (or at least a portion thereof) may optionally be omitted from the device 300 shown in FIG. 3C.

In some implementations, less than two chips can be coupled to one or more redistribution layers (e.g., redistribution layer 372) on side C1. In some implementations, the first chip 378 and/or the second chip 379 can be, or can include, a module. In some implementations, the first chip 378 and or the second chip 379 can be, or can include, a discrete device (e.g., a MOSFET device, an inductor, a passive component, and/or so forth).

FIG. 5A is a side cross-sectional view of yet another device 500, or a portion thereof, according to an implementation. As shown in FIG. 5A, the device 500 includes a capacitive component 580 having a capacitive plate 582 disposed within a molding layer 560 on side E1 (e.g., a first side) of a substrate 530. Interconnection components 550 and semiconductor die 542, 544 are disposed within a molding layer 540 on side E2 (e.g., a second side) of the substrate 530 of the device 500. In some implementations, the capacitive plate 582 can be a portion of (e.g., included in) a redistribution layer formed on side E1 of the substrate 530.

Several of the interconnection components 550 in FIG. 5A are defined by portions of a redistribution layer 552 (which can be referred to as redistribution layer portions) and conductive pillars 554. One or more portions of the interconnection components 550 can be included within an interconnection region (e.g., interconnection region 145 shown in FIG. 1). A surface plating layer 556 can be disposed between the device 500 and an external block 590.

As shown in FIG. 5A, the capacitive component 580 includes a capacitor CAP1 that is defined by the capacitive plate 582, a redistribution layer portion 552A, and the substrate 530 disposed between the capacitive plate 582 and the redistribution layer portion 552A. The capacitive plate 582 functions as a first capacitive plate of the capacitor CAP1, the redistribution layer portion 552A functions as a second capacitive plate of the capacitor CAP1, and the substrate 530 functions as a dielectric of the capacitor CAP1. Accordingly, the capacitor CAP1 uses the substrate 530 as a dielectric and has at least a portion disposed on one side of the substrate 530 (e.g., side E1) and another portion disposed on the opposite side of the substrate 530 (e.g., side E2).

In this implementation, the capacitive component 580 includes a capacitor CAP2 (i.e., a second capacitor) that is defined (similarly to CAP1) by the capacitive plate 582, a redistribution layer portion 552B, and the substrate 530 disposed between the capacitive plate 582 and the redistribution layer portion 552B. Accordingly, the capacitor CAP2 uses the substrate 530 as a dielectric and has at least a portion disposed on one side of the substrate 530 (e.g., side E1) and another portion disposed on the opposite side of the substrate 530 (e.g., side E2).

In this implementation, the capacitor CAP1 and the capacitor CAP2 share the capacitive plate 582. In other words, the capacitor CAP1 and the capacitor CAP2 include a common capacitive plate—capacitive plate 582. Although not shown in FIG. 5A, in some implementations, the capacitor CAP1 and the capacitor CAP2 can include different capacitive plates on side E1 of the substrate 530.

FIG. 5B is a diagram that illustrates an equivalent circuit of the capacitive component 580 and the semiconductor die 542, 544 shown in FIG. 5A. As shown in FIG. 5B, the capacitive component 580, which includes the capacitor CAP1 and the capacitor CAP2 in series, is disposed between the semiconductor die 542 and the semiconductor die 544. The diagram also illustrates a second set of capacitors CAP3 and CAP4 in parallel with the capacitors CAP1 and CAP2.

The capacitive component 580 can be used for signal isolation between the semiconductor die 542 and semiconductor die 544. In other words, the capacitive component 580 can be used to isolate signaling between the semiconductor die 542, 544. In some implementations, the signaling can include signal pulses, analog signals (produced using decimation techniques), relatively high frequency signals, relatively low frequency signals, and/or so forth. In some implementations, integration of one or more capacitive components used for signal isolation can be referred to as isolation integration.

In some implementations, the semiconductor die 542 and/or the semiconductor die 544 can include a variety of semiconductor devices and/or circuits. In some implementations, the semiconductor die 542 can include, for example, a driver circuit and the semiconductor die 544 can include, for example, a comparator circuit. The driver circuit can be configured to communicate using one-way communication with the comparator circuit via the capacitive component 580. In some implementations, two-way communication via one or more capacitive components similar to capacitive component 580 can be included in a variation of the device 500. In other words, in some implementations, multiple capacitors in parallel and series can be included in the device 500.

Referring back to FIG. 5A., in some implementations, the substrate 530 can be, or can include, for example, aluminum nitride (AlN), silicon nitride ($Si_3N_4$), alumina ($Al_2O_3$) or a derivative thereof, FR4, and/or so forth. In some implementations, a vertical dimension D1 (along the vertical direction A1), which can be referred to as a thickness or height, of the substrate 530 can be less than (e.g., thinner) than a vertical dimension D2 of the molding layer 540 and/or a vertical dimension D3 of the molding layer 560. In some implementations, the vertical dimension D1 of the substrate 530 can be configured for a target capacitance value of capacitor CAP1, capacitor CAP2, and/or a combined capacitance of capacitor CAP1 and capacitor CAP2. In some implementations, the vertical dimension D1 of the substrate 530 can be approximately equal to, or less than, the vertical dimension D2 and/or the vertical dimension D3. In some implementations, the substrate 530 can have a vertical dimension that can be thinned or increased for a target capacitance value.

Although illustrated in this embodiment as including series capacitors, one or more capacitive components formed within the device 500 can include two or more capacitors in parallel and/or two or more capacitors in series. Although not shown in FIG. 5A, the device 500 can include magnetic integration on side E1 and/or side E2 of the substrate 530. In such implementations, the capacitive component 580 (or a variation thereof) can be electrically coupled to a magnetic component on side E1 and/or on side E2 of the substrate 530 using, for example, a redistribution layer, one or more conductive pillars, and/or so forth. In some implementations, the device 500 can include interconnection integration on side E1 of the substrate 530. In some implementations, the device 500 can exclude interconnection integration from, for example, side E2 of the substrate 530.

Although not shown in FIG. 5A, in some implementations, a capacitive component included in device 500 can be configured with a capacitor (e.g., a single capacitor) coupled to the redistribution layer 552 through a conductive via. In such implementations, capacitor CAP1 or capacitor CAP2 can be eliminated. In such implementations, a conductive via formed within (e.g., formed through) the substrate 530 can have a first end coupled to (e.g., directly coupled to) the capacitive plate 582 and can have a second end coupled to (e.g., directly coupled to) the redistribution layer 552.

Although not shown in FIG. 5A or FIG. 5B, in some implementations, the capacitive component 580 (or a variation thereof) can be used for signal isolation between a semiconductor device (e.g., a circuit) included in the device 500 and a semiconductor device external to the device 500, such as a circuit included in, or coupled to, the external block 590. In such implementations, an interconnection component disposed through the entirety of the molding layer 540 (e.g., interconnection component 350B shown in FIGS. 3A through 3C) can be electrically coupled to the capacitive component 580.

Although not shown in FIG. 5A, in some implementations, multiple capacitive components can be formed so that at least some portions of the capacitive components are lateral to one another within the same horizontal plane (e.g., plane A4). In some implementations, multiple capacitive components can be formed vertically on top of one another so that the capacitive components are vertically stacked along vertical direction Al.

In some implementations, the capacitive plate 582, the conductive pillars 554, and/or the redistribution layer 552 can be formed of a metal such as copper, aluminum, and/or so forth. In some implementations, the capacitive plate 582, the conductive pillars 554, and/or the redistribution layer 552 can be formed using, for example, an electroplating process.

FIG. 5C is a side cross-sectional view of a variation of a portion of the device 500 shown in FIG. 5A. As shown in FIG. 5A, the device 500 includes a capacitive component CAPM having at least a portion embedded within the substrate. Although not labeled, the capacitive component CAPM includes multiple (at least a pair of) capacitive plates (also can be referred to as electrodes) and a dielectric (also can be referred to as a dielectric layer) disposed between the capacitive plates. The capacitive plates and dielectric of the capacitive component CAPM are disposed within the substrate 530. In this implementation, the capacitive component CAPM is electrically coupled to other components within the device 500 using vias 599. The capacitive component CAPM is coupled to redistribution layer portion 552A on side E1 of the substrate 530 using one of the vias 599 and is coupled to electrode 582A (which can be part of a redistribution layer) on side E2 using another of the vias 599. The capacitive component CAPM can be used for, for example, signal integrity (decoupling) applications.

Although not shown, in some implementations, the capacitive component CAPM can have at least a portion exposed. For example, at least a portion of the capacitive component CAPM (e.g., a capacitive plate, at least a portion of the dielectric) can be outside of (or exposed outside of) the substrate 530 (e.g., on side E1 or side E2 of the substrate). Although not shown, in some implementations, a capacitive component such as the capacitive component CAPM can be coupled to a surface (e.g., a top surface, a bottom surface) of the substrate 530.

FIGS. 6A through 6G are side cross-sectional views that illustrate formation of the device 300 shown in FIG. 3A, according to an implementation. Many of the formation elements shown in FIGS. 6A through 6G can be used to form portions of FIGS. 3B and 3C. Descriptions related to these variations are also described below.

In this implementation, the device 300 includes both magnetic integration and interconnection integration and, accordingly, processing for many of the layers is performed on both sides of the substrate 330. In some implementations, the device 300 can also include isolation integration. In some embodiments, magnetic integration and/or interconnection integration can be excluded from the device 300. In some implementations, one or more of the processing steps can be performed as a batch process (with other devices) or as a continuous process. In some implementations, final testing can also be performed in batch processes (with other devices) to reduce test cost and decrease manufacturing cycle time. After final test, the device 300 can be singulated from other devices (e.g., other connected or grouped devices) into the individual devices shown in FIGS. 3A through 3C.

In some implementations, one or more processing steps can be performed simultaneously, serially, or in an interleaved fashion. For example, in some implementations, processing (e.g., plating, deposition) can be performed on side C1 of the substrate 330, following which processing can be performed on side C2 of the substrate 330. In some implementations, processing (e.g., etching) can simultaneously be performed on both side C1 and side C2 of the substrate 330. More details related to processing order will be described in connection with the processing steps below.

Figure 6A:
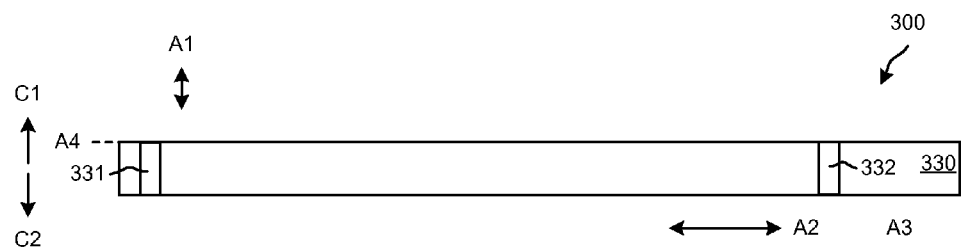
FIGS. 6A through 6G are side cross-sectional views that illustrate formation of the device shown in, for example, FIGS. 3A through 3C, according to an implementation.

FIG. 6A is a diagram that illustrates a substrate 330. As shown in FIG. 6A, substrate vias (or openings) 331, 332 are formed (e.g., formed using an etch or mechanical process (e.g., a drilling process)) within the substrate 330. In some implementations, the substrate can include any of the substrate materials described above. The substrate 330 can have a shape (e.g., a vertical dimension, an area) that facilitates assembly of a multitude of individual devices (e.g., packages) similar to device 300.

The substrate 330 shown in FIG. 6A can be seeded (on side C1 and on side C2) with a metal, such as copper, as preparation for electroplating of the bottom redistribution layer 372 and the redistribution layer 352. Although not shown in FIG. 6A or 6B, after the seeding process has been performed a photosensitive material (e.g., a dry film), that can function as a photoresist layer for redistribution layer formation, is disposed on each of the seed layers. In some implementations, the photoresist layers for redistribution layer formation can each be referred to as a redistribution photoresist layer.

Figure 6B:
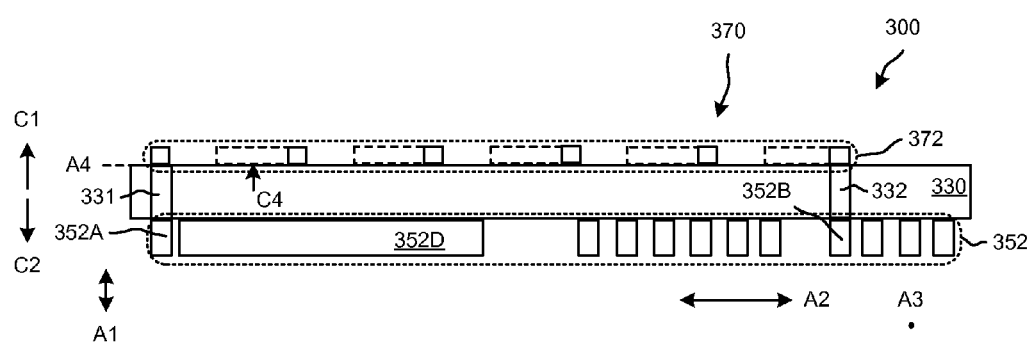

Using a photolithography process, redistribution photoresist layers (on each side of the substrate 330) can be patterned together or individually such that areas to be electroplated are removed. Gaps or openings in the redistribution photoresist layers are electroplated to form the bottom redistribution layer 372 and the redistribution layer 352 shown in FIG. 6B. In some implementations, CMP is used to polish/remove the electroplated layer. FIG. 6B illustrates the device 300 after the redistribution photoresist layers have been removed.

In some implementations, the entire surface of both sides of the substrate 330 can first be electroplated (using one or more processing steps). Subsequently, portions of the electroplated areas can be removed using one or more redistribution photoresist layers, photolithography processes, and etching processes to form the bottom redistribution layer 372 and the redistribution layer 352.

Although not shown in FIG. 6A through 6G, the redistribution layer 352 and/or the redistribution layer 372 can be associated with a capacitive component. In other words, the redistribution layer 352 and/or the redistribution layer 372 can be associated with isolation integration. In some implementations, a conductive via (such as conductive vias 331, 332) can be formed as part of a capacitive component.

Figure 6C:
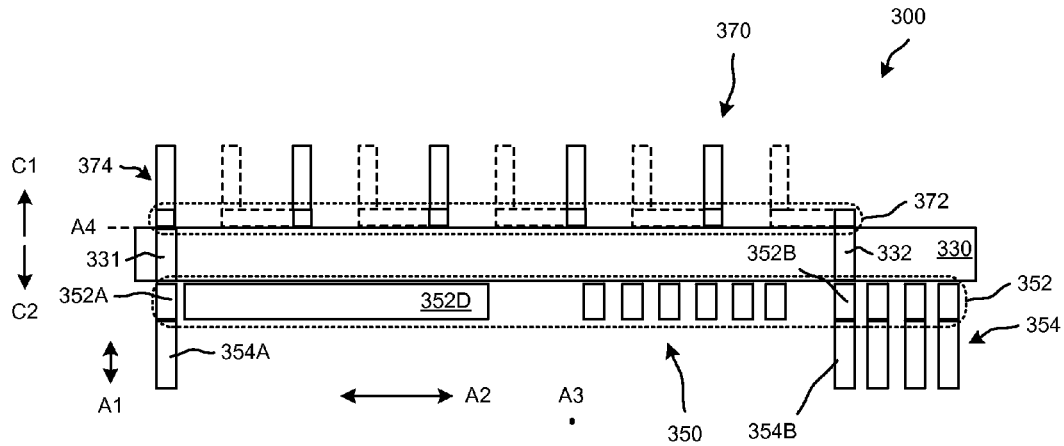

After the redistribution layers 352, 372 have been formed, a photoresist layer for formation of conductive pillars can be formed on each side of the substrate 330. In some implementations, the photoresist layers for formation of conductive pillars can each be referred to as a pillar photoresist layer. The pillar photoresist layers can be patterned using photolithography techniques (e.g., a photolithography process, an etching process). Specifically, using a photolithography process, pillar photoresist layers (on each side of the substrate 330) can be patterned such that areas to be electroplated are removed. Gaps or openings in the pillar photoresist layers can then be electroplated to form the conductive pillars 654 and the conductive pillar 664 shown in FIG. 6C. FIG. 6C illustrates the device 300 after the pillar photoresist layers have been removed.

In some implementations, one or more of the redistribution photoresist layers can remain on the device 300 when one or more of the pillar photoresist layers are formed on the device 300. In some implementations, one or more of the redistribution photoresist layers can be polished (e.g., polished using a chemical mechanical polishing (CMP) process) and/or cleaned before one or more of the pillar photoresist layers are formed.

Figure 6D:
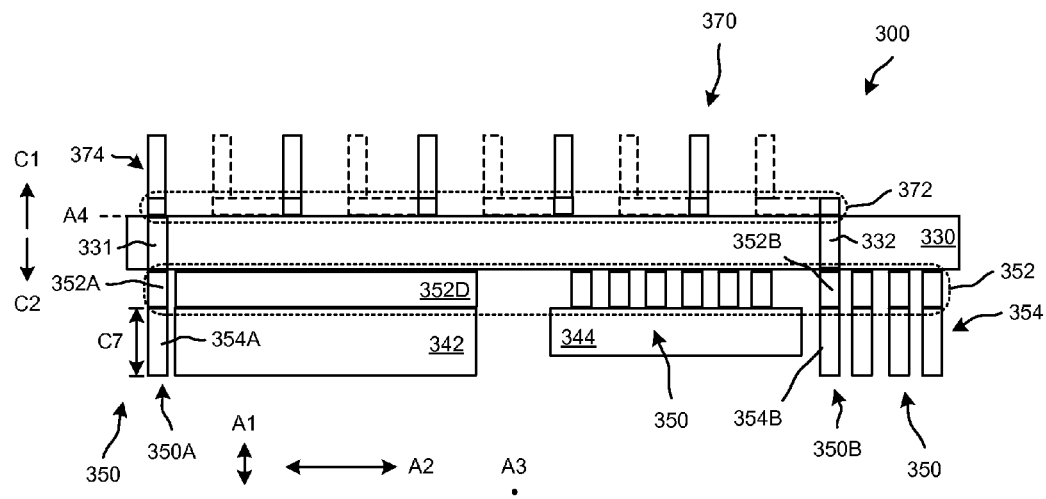

After the conductive pillars 354, 364 have been formed, the semiconductor die 342, 344 and/or other components (e.g., other passive components) (not shown) are coupled to (e.g., placed on, fused to) one or more conductors (e.g., pads) formed within the redistribution layer 352 as shown in FIG. 6D. Although not shown in FIG. 6D, in some implementations, one or more semiconductor die and/or other components can be coupled to a portion the bottom redistribution layer 372.

In some implementations, one or more processes can be used to couple the semiconductor die 342, 344 (and/or other components) to the redistribution layer 352. For example, the coupling (e.g., via a coupling layer) can be performed using a conductive epoxy, soldering, metal-to-metal bonding (e.g., copper-to-copper bonding), bonding using nano-particle silver or other materials, and/or so forth. In some implementations, the semiconductor die 342, 344 (and/or other components) can be mechanically modified (e.g., polished using a CMP process, modified using a grinding process) a vertical dimension approximately equal to the vertical dimension C7 of the conductive pillars 354 so that the semiconductor die 342, 344 (and/or other components) can be at least partially disposed within or encapsulated within the molding layer 340 (not shown in FIG. 6D).

In some implementations, the vertical dimension of one or more of the semiconductor die 342, 344 (and/or other components) can be less than (e.g., thinner) than the vertical dimension C7 of the conductive pillars 354. In some implementations, the vertical dimension of the semiconductor die 342, 344 (and/or other components) can be greater than (e.g., thicker than) the vertical dimension C7 of the conductive pillars 354. In such implementations, one or more of the semiconductor die 342, 344 (and/or other components) can be mechanically modified after being coupled to the redistribution layer 352.

Figure 6E:
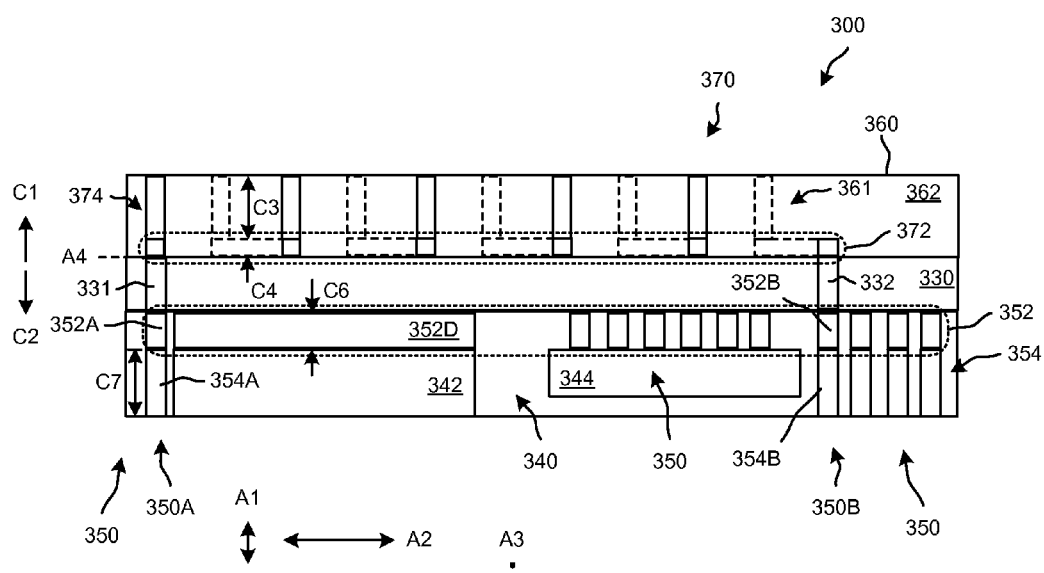

After the semiconductor die 342, 344 (and/or other components) are coupled to the redistribution layer 352, molding layers can be formed within the device 300 as shown in FIG. 6E. Specifically, a sub-layer 362 of the molding layer 360 can be formed on side C1 of the device 300 and molding layer 340 can be formed on side C2 of the device 300. In some implementations, sub-layer 362 of the molding layer 360 can include the portion 361, which includes a magnetic substance.

There are also a number of options that can be utilized for forming the molding layer 340 and/or the molding layers 360 (or portions thereof) such as transfer molding, pressure molding layer, and so forth. In some implementations, a vertical dimension of the molding layer 340 on side C2 can be targeted to be slightly greater than a height of the interconnection components 350 (including the conductive pillars 354) and a height of the semiconductor die 342 (including the vertical dimension of the redistribution layer portion 352D). Similarly, a vertical dimension of the sub-layer 362 of the molding layer 360 on side C1 can be targeted to be slightly greater than a height of the conductive pillars 354 (including the vertical dimension of the bottom redistribution layer 372).

After the molding layer 340 and the sub-layer 362 of the molding layer 360 have been initially formed, a mechanical modification process (e.g., grinding process, a polishing process) can be used to remove at least a portion of the molding layer 340 and/or the sub-layer 362 of molding layer 360 to expose ends of the conductive pillars 354 and to expose ends of the conductive pillars 374. The mechanical modification process can also be used to expose a portion of the semiconductor die 342. In some implementations, the portion of the semiconductor die 342 that is exposed can be a drain portion, a source portion, and/or a gate portion of a semiconductor device included in the semiconductor die 342.

In some implementations, the mechanical modification process can include thinning of side C1 and/or side C2. The thinning of side C1 can include removing, for example, portions of the semiconductor die 342 (and/or the semiconductor die 344), the conductive pillars 354, the molding layer 340, and/or so forth. The thinning of side C2 can include removing, for example, portions of the conductive pillars 374, the molding layer 360, and/or so forth. Accordingly, the overall vertical dimension (or thickness) of the device 300 can be reduced beyond that shown in, for example, FIG. 6E.

Figure 6F:
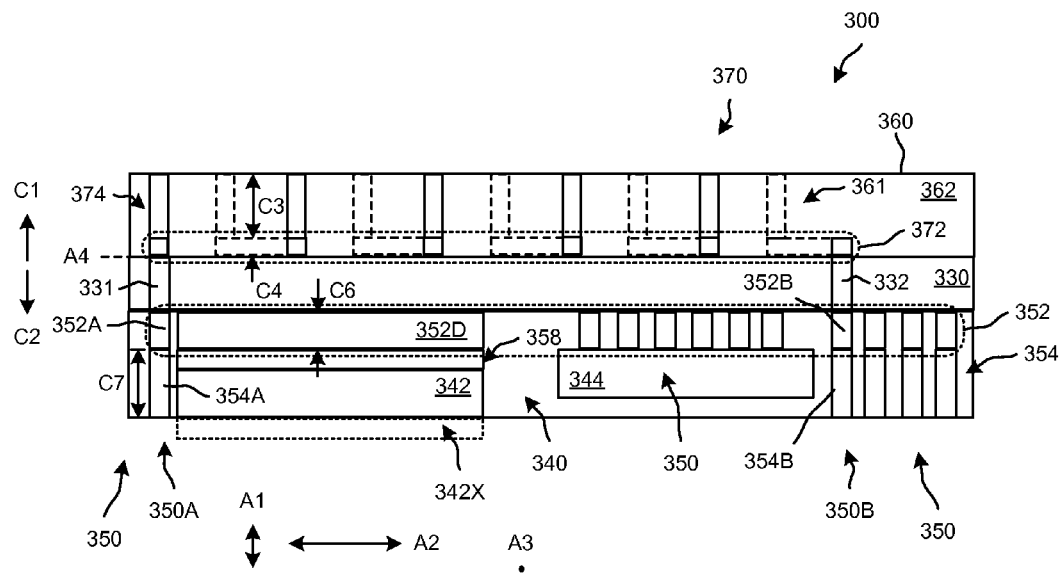

As shown in FIG. 6F, in a variation of the process flow, an additional redistribution layer 358 (or portion thereof) (also can be referred to as a second redistribution layer) can be formed (e.g., disposed) between the redistribution layer 352 (also can be referred to as a first redistribution layer) and, for example, the semiconductor die 342. In such implementations, a mechanical modification process can result in thinning the semiconductor die 342. Specifically, the mechanical modification process can be used to remove a portion 342X of the semiconductor die 342 (which is shown as a dashed line) and thin the semiconductor die 342 beyond that shown in FIG. 6E because of the additional redistribution layer 358 disposed between the redistribution layer 352 and the semiconductor die 342.

Figure 6G:
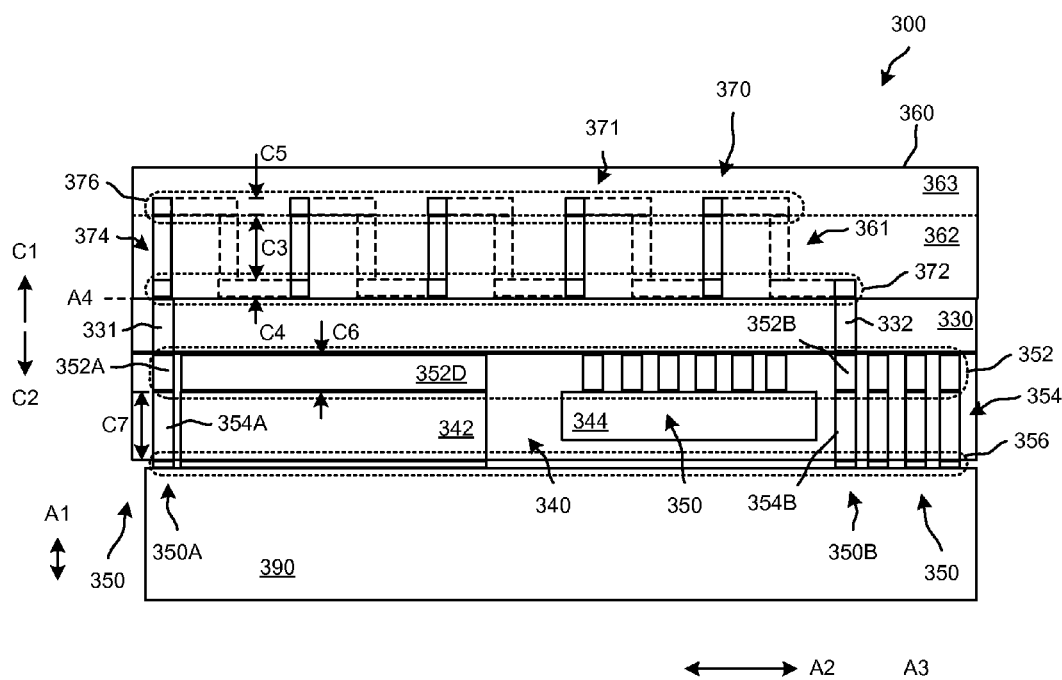

Following the mechanical modification process on side C2, the surface plating layer 356 can be formed as shown in FIG. 6G. The surface plating layer 356 can include conductors (e.g., metal connections) to the exposed semiconductor die 342 and the interconnection components 350. In some implementations, the surface plating layer 356 can have a surface area that extends to one or more edges of the device 300, provides a relatively large surface area for a connection, can have conductors that can provide electrical connection or traces to, for example, locations within the external block 390, and/or so forth. For example, in some implementations, a portion of the surface plating layer 356 can have a surface area that is greater than a surface area of an exposed portion of the semiconductor die 342. The portion of the surface plating layer 356 can have a relatively large surface area that can be used as a convenient electrical connection for a portion of the external block 390. In some implementations, a portion of the surface plating layer 356 can have a surface area that is equal to or less than a surface area of exposed portion of the semiconductor die 342. An example of a surface plating layer that has a surface area less than a surface area of an exposed portion of a semiconductor die is discussed in connection with at least FIGS. 11A and 11B.

In some implementations, the surface plating layer 356 can be formed using a variety of plating processes. For example, in some implementations, a titanium-silver seed can be deposited and patterned using a photolithography processes. These processes can be followed by a solder plating process as a final finish layer.

In this implementation, the top redistribution layer 376 can be formed before or after the surface plating layer 356 is formed. In some implementations, at least some portions of the top redistribution layer 376 can be formed simultaneous to the surface plating layer 356. Upon formation of the top redistribution layer 376, the winding 371 is formed.

Also, as shown in FIG. 6G, the top redistribution layer 376 is encapsulated within sub-layer 363 of the molding layer 360. In some implementations, the sub-layer 363 can exclude a magnetic substance, or can be made of the same material as the sub-layer 362 (which includes magnetic substance). The sub-layer 363 of the molding layer 360 can be formed using one or more molding processes, and/or can be formed before or after the surface plating layer 356 is formed. In some implementations, the sub-layer 363 can be, or can include, for example, a passivation layer.

In some implementations, process flow shown in FIGS. 6A through 6G can be modified for several variations. For example, to form the implementations shown in, for example, FIGS. 3B and 3C, formation of the conductive pillars 374 can be omitted. Instead, passive devices, conductive coils (e.g., conductive coils formed using a wire (e.g., wire 377 shown in FIG. 3B)), and/or so forth can be coupled to the bottom redistribution layer 372 (which can be used to form pads) and the molding layer 340 can be formed over the passive devices, conductive coils, and/or so forth. In some implementations, the pattern of the bottom redistribution layer 372 on the substrate 330 can be different than that shown in, for example, FIG. 6B to accommodate passive devices, conductive coils, and/or so forth.

Figure 7:
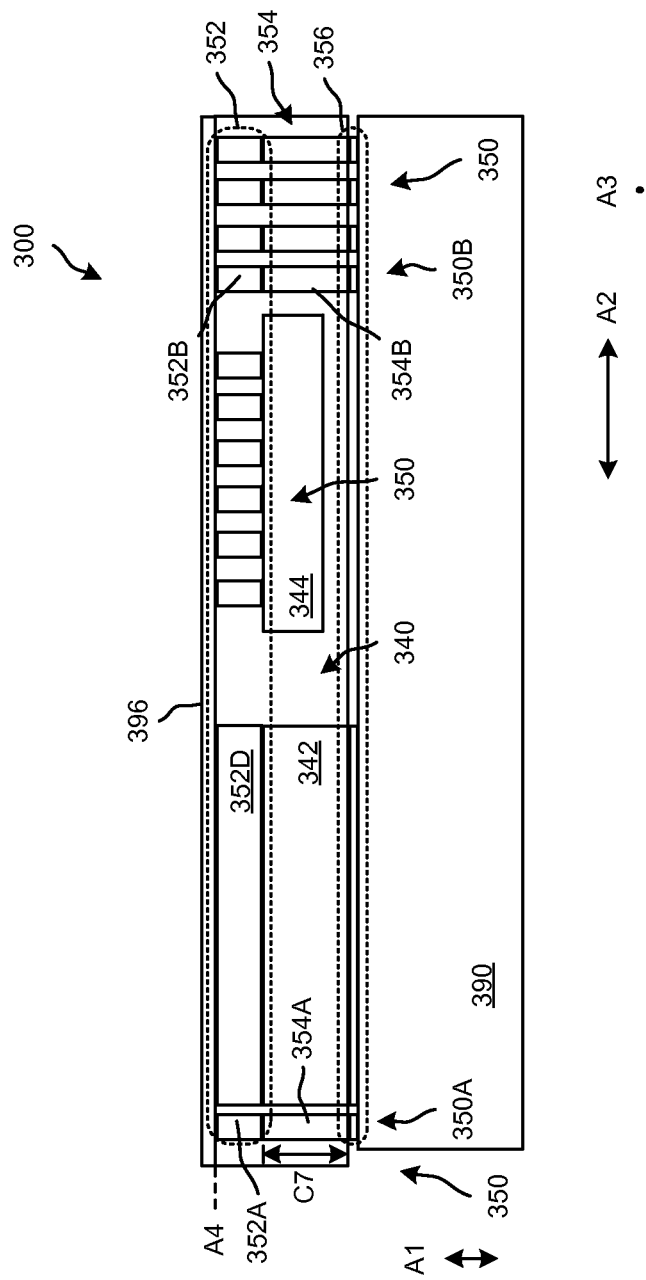
FIG. 7 is a diagram that illustrates a variation of the device shown in FIGS. 3A and 3B.

If the device 300 is produced without magnetic integration on side C1, the substrate 330 can be partially (e.g., thinned) or completely removed using a mechanical process (e.g., a grinding process, polishing process). In such embodiments, the molding layer 340 can function as the primary structural component of the device 300. A passivation layer (e.g., a lamination layer) can be used to seal the device 300 after the substrate 330 has been removed. An example of this type of structure is shown in FIG. 7, which is a variation of the device 300 shown in FIGS. 3A through 3C. In such implementations, the use of a relatively low-cost substrate 330 as an intermediate carrier can be used during production.

After removal of the substrate 330, a cover 396 (e.g., a lamination layer, a cap, a passivation layer) as shown in FIG. 7 is disposed on (e.g., coupled to) at least a top surface of the device 300 to encapsulate or cover at least some portions of the device 300 (e.g., exposed conductors included in the redistribution layer 352). In some implementations, at least a portion of the substrate 330 can be maintained on the top surface of the device 300 as a cover. In some implementations, a cover similar to the cover 396 can be disposed on or coupled to other surfaces (e.g., side surfaces) of the device 300.

In some implementations and as discussed above, a stand-along magnetic component/device and/or a stand-along capacitive component/device can be formed using the techniques described above. In such implementations, for example, an inductive component can be formed on a substrate with or without interconnection integration and/or without (e.g., excluding) a semiconductor die included in the device. As another example, in such implementations, a capacitive component can be formed around a substrate with or without interconnection integration and/or without (e.g., excluding) a semiconductor die included in the device.

As mentioned above in connection with FIGS. 6A through 6G, in some implementations, one or more processing steps (e.g., seed layer steps, electroplating steps, photoresist steps, etching steps, etc.) can be performed simultaneously, serially, or in an interleaved fashion. For example, in some implementations, the redistribution layer on one side (e.g., bottom redistribution layer 372 on side C1) can be formed before the redistribution layer on the other side (e.g., redistribution layer 352 on side C2) is formed.

In some implementations, one or more portions of the bottom redistribution layer 372 on side C1 can be formed in an interleaved fashion with the redistribution layer 352 on side C2. In other words, processing steps associated with side C1 can be performed between processing steps associated with side C2 (or vice versa). For example, a seed layer for the bottom redistribution layer 372 can be formed before a seed layer for the redistribution layer 352 is formed. After electroplating has been formed for both bottom redistribution layer 372 and redistribution layer 352, a pattern defining the bottom redistribution layer 372 can be etched, after which a pattern defining the redistribution layer 352 can be etched.

In some implementations, the structures on side C2 of the substrate 330 can be formed before at least some of the structures are formed on side C1 of the substrate 330, or vice versa. In such implementations, the structures can be formed on one side of the substrate 330, and the substrate 330 (and structures) can be flipped to form additional structures on the other side of the substrate 330. In such embodiments, the substrate 330 can be at least partially removed (e.g., thinned) after the structures are formed on side C2, but before the structures are formed on side C1 of the substrate, or vice versa.

FIGS. 8A through 8H are diagrams that illustrate a perspective view of formation of a device 800. Although, these diagrams illustrate formation of interconnection integration, many of the processing steps illustrated in FIGS. 8A through 8H can be used in conjunction with magnetic integration and/or isolation integration.

FIG. 8A is a diagram that illustrates a substrate 830 that has a square shape or profile. In some implementations, the substrate 830 can have a rectangular shape or can have a different shape (or profile).

As shown in FIG. 8B a redistribution layer 852 is formed using an electroplating process that can include, for example, seeding, photolithography, etching, and/or so forth. Portions of the redistribution layer 852 can have a variety of shapes. For example, the redistribution layer 852 can include pads 857 and/or connectors 858 that can be coupled to one or more semiconductor die 841, 842, and/or 843 (such as shown in FIGS. 8C and 8E, for example).

As shown in FIG. 8C, conductive pillars 854 are formed on the redistribution layer 852. The conductive pillars 854 include portions 854A through 854C, which can each be referred to as conductive pillar portions 854A through 854C. As shown in FIG. 8C, the conductive pillars 854 can have a variety of lateral dimensions and lengths. In some implementations, one or more of the conductive pillars 854 can function as an input pin and/or as an output pin of one or more semiconductor devices included in one or more of the semiconductor die 841, 842, 843 (such as shown in FIG. 8E). As shown in FIG. 8C, the conductive pillars 854 and the portions of the redistribution layer 852 have a variety of shapes, aspect ratios, and cross-sectional profiles.

As shown in FIG. 8D, portions of a bonding agent 862 (e.g., conductive epoxy, solder) are disposed on at least some portions of the redistribution layer 852 so that one or more of the semiconductor die 841 through 843 can be coupled to the redistribution layer 852 as shown in FIG. 8E. In some implementations, materials in addition to or instead of the bonding agent 862 can be used to couple the semiconductor die to the redistribution layer 852. In some implementations, a reflow process can be performed after the semiconductor die 841 through 843 have been coupled to the redistribution layer 852.

In some implementations, each of the semiconductor die 841 through 843 can include a variety of semiconductor devices. For example, in some implementations, the semiconductor die 841 can be, or can include, a low-side MOSFET device, and the semiconductor die 841 can be, or can include, a high-side MOSFET device. The semiconductor die 843 can be, or can include, an integrated circuit including a driver device.

Cross-sectional views cut along line G1 and line G2 are shown in FIG. 9A and FIG. 9B, respectively. Some of the relative dimensions of the device 800 are illustrated in FIGS. 9A and 9B. A top surface of the molding layer 840 (not shown in FIGS. 9A and 9B but shown in FIGS. 8F through 8H) is illustrated as a dashed line I1.

As shown in FIG. 9A, a combined vertical dimension (or height) of the semiconductor die 841 and the bonding agent 862 is approximately equal to a vertical dimension H1 of the conductive pillar portion 854C. The semiconductor die 841 has a vertical dimension H2 and the bonding agent 862 has a vertical dimension H3. Similarly, a combined vertical dimension of the semiconductor die 842 (which has a vertical dimension H4) and the bonding agent 862 is approximately equal to the vertical dimension H1 of the conductive pillar portion 854C of the conductive pillars 854. In this implementation, the conductive pillar portion 854C, and the semiconductor die 841, 842 are disposed on the redistribution layer 852. Accordingly, a stack including the conductive pillar portion 854C and the redistribution layer 857 has a vertical dimension (or height) approximately equal to a vertical dimension of a stack including the semiconductor die 841 (or the semiconductor die 842), the bonding agent 862, and the redistribution layer 852.

In contrast, as shown in FIG. 9B, a stack (e.g., a vertical stack) disposed on the redistribution layer 852 and associated with the semiconductor die 843 has a vertical dimension H5 that is less than the vertical dimension H9 of, for example, one of the conductive pillar portions 854A of the conductive pillars 854 (and/or the conductive pillar portion 854C). The stack associated with the semiconductor die 843 (along line I2) includes the bonding agent 862, a portion of a conductive pillar 854, and the semiconductor die 843. The portion of the conductive pillar 854 is disposed between the bonding agent 862 and the semiconductor die 843. Also, in some implementations, the stack can include at least a portion of the redistribution layer 852 so that the bonding agent 862 and the portion of the conductive pillar 854 are disposed between the semiconductor die 843 and the portion of the redistribution layer 852.

As shown in FIG. 9B, the semiconductor die 843 has a top surface lower than a top surface of, for example, the semiconductor die 841, which corresponds approximately with the top surface of the molding layer 840 (not shown in FIG. 9B but shown in FIGS. 8F through 8H) illustrated by the dashed line I1. The top surface of the semiconductor die 843 has a distance H6 from the dashed line I1. In some implementations, the distance H6 can be less than a vertical dimension H7 of the semiconductor die 843. In some implementations, the vertical dimension H6 can be approximately equal to or greater than the vertical dimension H7 of the semiconductor die 843.

In some implementations, the vertical dimension H1 of the conductive pillar can be between approximately a few micrometers and thousands of micrometers (e.g., 10 microns (µm), 50 µm, 125 µm, 1000 µm, 2000 µm). As shown in FIG. 9A, the vertical dimension H3 of the bonding agent 862 is less than the vertical dimension H2 of the semiconductor die 841 and/or the vertical dimension H4 of the semiconductor die 842. In some implementations, the vertical dimension H3 of the bonding agent 862 can be approximately between a few micrometers and hundreds of micrometers (e.g., 10 µm, 25 µm, 100 µm, 200 µm). Similarly, in some implementations, the redistribution layer 852 can have a vertical dimension H8 of approximately between a few micrometers and hundreds of micrometers (e.g., 10 µm, 25 µm, 40 µm, 100 µm, 200 µm).

In some implementations, the vertical dimension of one or more of the semiconductor die 841, 842, 843 can be approximately between a few micrometers and thousands of micrometers (e.g., 10 µm, 50 µm, 125 µm, 1000 µm, 2000 µm). In some implementations, the substrate 830 can have a vertical dimension H10 of approximately between a few micrometers and thousands of micrometers (e.g., 10 µm, 50 µm, 125 µm, 600 µm, 1000 µm, 2000 µm).

As shown in FIG. 9A, a distance H11 between the conductive pillar portion 854C and the semiconductor die 842 is approximately equal to a lateral dimension H12 of the conductive pillar portion 854C. In some implementations, the distance H11 between the conductive pillar portion 854C and the semiconductor die 842 can be less than or greater than the lateral dimension H12 of the conductive pillar portion 854C. Similarly, as shown in FIG. 9B, a distance H13 between the conductive pillar portion 854A and the semiconductor die 841 is approximately equal to a lateral dimension H14 of the conductive pillar portion 854A. In some implementations, the distance H13 between the conductive pillar portion 854A and the semiconductor die 841 can be different than (e.g., less than or greater than) the lateral dimension H14 of the conductive pillar portion 854A. In some implementations, the lateral dimension H12 of the conductive pillar portion 854C and/or the lateral dimension H14 of the conductive pillar portion 854A can be approximately between a few micrometers and thousands of micrometers (e.g., 10 µm, 50 µm, 125 µm, 1000 µm, 2000 µm).

As shown in FIG. 9A, a distance H15 between portions of the redistribution layer 852 (and features disposed thereon) can be less than the lateral dimension H12 of the conductive pillar portion 854C. Similarly, as shown in FIG. 9B, a distance H16 between semiconductor die 843 and semiconductor die 841 can be less than the lateral dimension H14 of the conductive pillar portion 854A. In some implementations, the distance H15 and/or the distance H16 can be approximately between tens of micrometers and thousands of micrometers (e.g., 10 µm, 50 µm, 125 µm, 1000 µm, 2000 µm). The semiconductor die 841, 842, and/or 843 can be as smaller than or equal to 1 mm$^2$.

Referring now to FIG. 8F, after the semiconductor die 841 through 843 have been coupled to the redistribution layer 852 via the bonding agent 862, a molding layer is disposed on the device 800 to encapsulate portions of the device 800. The molding layer 840, and other components included in the device 800, can be mechanically modified (e.g., polished, modified using the grinding process) so that at least some of the components are exposed through the molding layer 840. In this implementation, at least a portion (e.g., a surface) of the semiconductor die 841 and at least a portion (e.g., a surface) of the semiconductor die 842 are exposed through the molding layer 840. Also, at least some portions (e.g., surfaces) of the conductive pillars 854 (labeled as conductive pillar portions 854A, 854B, and 854C) can be exposed through the molding layer 840.

Figure 8H:
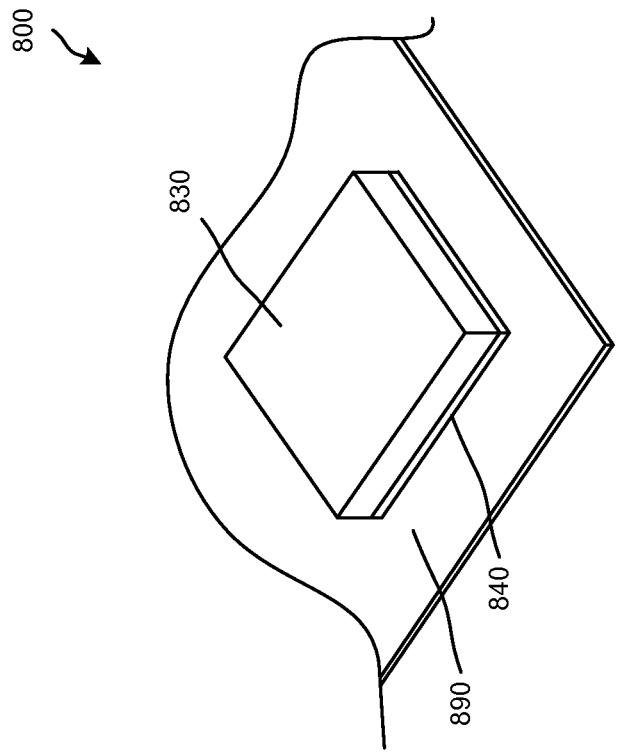
Figure 8G:
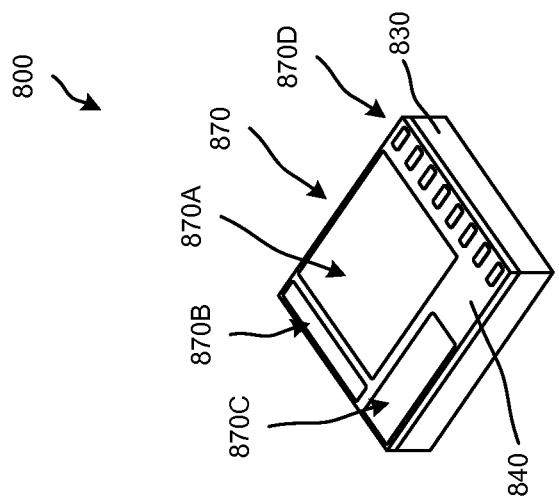

A surface plating layer 870, which includes portions 870A through 870D, is formed as shown in FIG. 8G over the exposed portions of conductive pillar portions 854A through 854C of the conductive pillars 854 and the exposed portions of the semiconductor die 841, 842. In this implementation, the portions of the surface plating layer 870 have surface areas that are generally greater than the corresponding surface areas of the conductive pillars 854 to which the portions of the surface plating layer 870 are coupled.

For example, portions 870D of the surface plating layer 870 are disposed over and coupled to exposed portions of conductive pillar portions 854A. In this implementation, each of the portions 870D has a surface area that is greater than a surface area of each of the conductive pillar portions 854A. Also, in this implementation, a surface area of a portion 870A of the surface plating layer 870 is greater than a surface area of an exposed portion of the semiconductor die 841 to which the portion 870A is coupled. Further, in this implementation, a surface area of a portion 870B of the surface plating layer 870, which is disposed over the conductive pillar portion 854B, is greater than a surface area of the conductive pillar portion 854B.

The portion 870C is disposed over both the semiconductor die 842 and the exposed portion of conductive pillar portion 854C. In this implementation, the portion 870C has a surface area greater than a combined surface area of the exposed portion of the semiconductor die 842 and the conductive pillar portion 854C of the conductive pillars 854. Accordingly, in this implementation, the portion 870C has a surface area greater than a surface area of the exposed portion of the semiconductor die 842 and greater than a surface area of the exposed portion of the conductive pillar portion 854C of the conductive pillars 854.

Although not shown in FIG. 8G, in some implementations, a surface area of a portion of the surface plating layer 870 can be approximately equal to or smaller than the exposed portions of one or more of the semiconductor die 841, 842 and/or one or more of the exposed portions of the conductive pillar portions 854A through 854C of the conductive pillars 854 disposed below (and coupled to) the portion of the surface plating layer 870.

FIG. 8H illustrates the device 800 coupled to an external block 890 via the surface plating layer 870 (not shown in FIG. 8H). As shown in FIG. 8H, the molding layer 840 is disposed between the substrate 830 and the external block 890.

Because the device 800 is produced without magnetic integration, the substrate 830 can be partially or completely removed by a chemical process and/or a mechanical process (e.g., a grinding process, a polishing process, an etch process) in some implementations (before being coupled to the external block 890). In such embodiments, the molding layer 840 can function as the primary structural component of the device 800.

Figure 10:
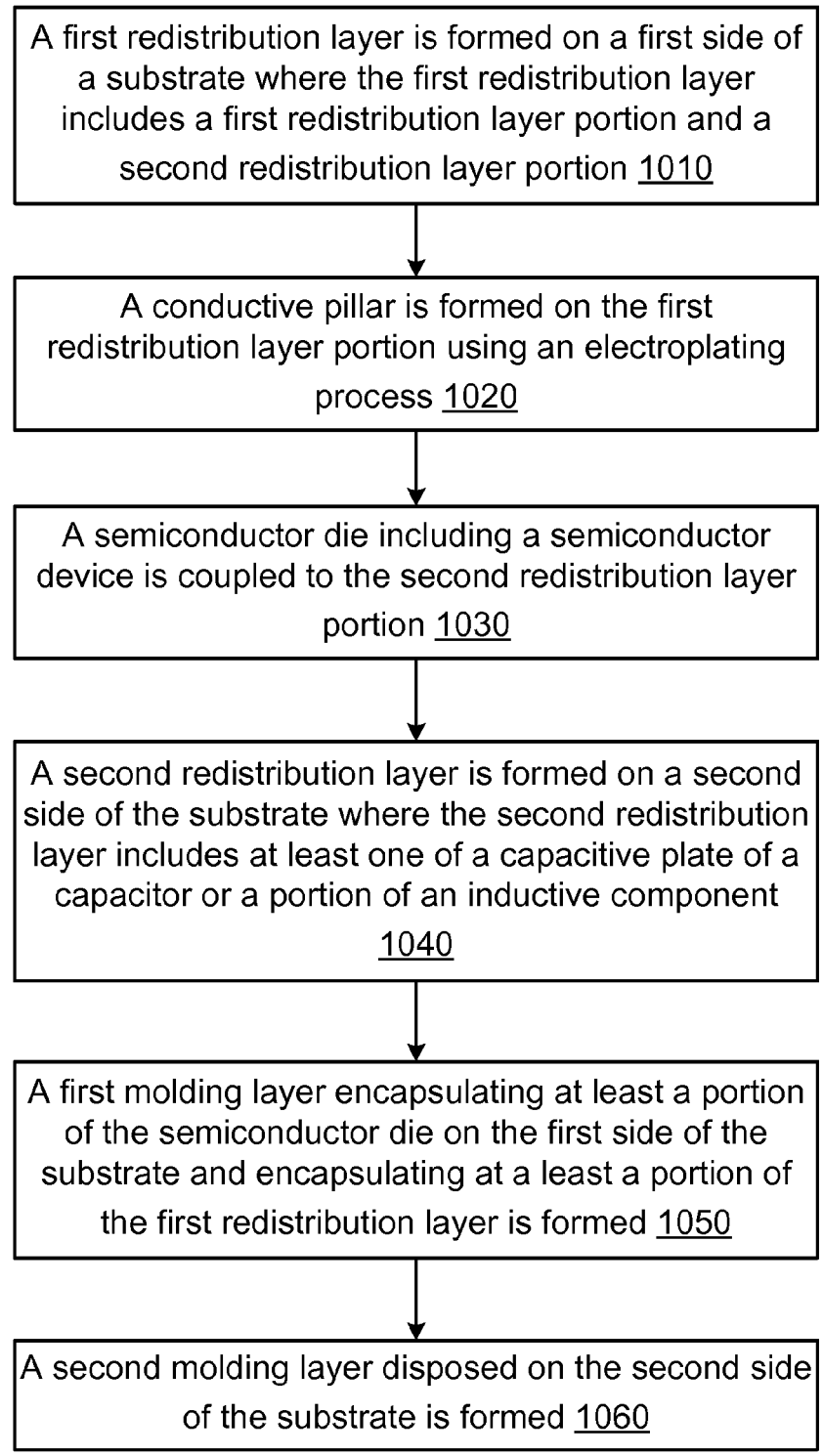
FIG. 10 is a flowchart that illustrates a method for forming one or more of the devices described herein.

FIG. 10 is a flowchart that illustrates a method for forming one or more of the devices described herein. For example, the flowchart can illustrate a method for forming one or more the devices 300 shown in FIGS. 3A through 3C.

A first redistribution layer is formed on a first side of a substrate where the first redistribution layer can include a first redistribution layer portion and a second redistribution layer portion (block 1010). The first redistribution layer can be, for example, redistribution layer 252 shown in FIGS. 2A through 2C, redistribution layer 352 shown in FIG. 3, redistribution layer 552 shown in FIG. 5A, and so forth.

A conductive pillar is formed on the first redistribution layer portion using an electroplating process (block 1020). The conductive pillar can be, for example, one of the conductive pillars 254 shown in FIG. 2A through 2C, one of the conductive pillars 354 shown in FIGS. 3A through 3C, one of the conductive pillars 554 shown in FIG. 5A, and so forth.

A semiconductor die including a semiconductor device is coupled to the second redistribution layer portion (block 1030). The semiconductor die can be, for example, semiconductor die 244 shown in FIG. 2A through 2C, semiconductor die 344 shown in FIG. 3, and so forth. In some implementations, the semiconductor die can be coupled to the second redistribution layer portion using, for example, a conductive epoxy, a soldering element, and so forth.

A second redistribution layer is formed on a second side of the substrate where the second redistribution layer includes at least one of a capacitive plate of a capacitive component or a portion of an inductive component (block 1040). In some implementations, the capacitive component can be, for example, the capacitive component 580 shown in FIG. 5A. In some implementations, the inductive component can be, for example, the inductive component 370 shown in FIG. 3.

A first molding layer encapsulating at least a portion of the semiconductor die on the first side of the substrate and encapsulating at a least a portion of the first redistribution layer is formed (block 1050). The first molding layer can be, for example, molding layer 240 shown in FIGS. 2A through 2C, molding layer 340 shown in FIG. 3, molding layer 540 shown in FIG. 5A, and so forth.

A second molding layer disposed on the second side of the substrate is formed (block 1060). The second molding layer can be, for example, molding layer 260 shown in FIGS. 2A through 2C, molding layer 360 shown in FIGS. 3A through 3C, molding layer 560 shown in FIG. 5A, and so forth.

Although the method above describes formation of at least one of a capacitive component or an inductive component, in some implementations, formation of at least one of the capacitive component or the inductive component can be optional. In such implementations, the second molding layer can optionally be formed. In some implementations, at least a portion of the substrate can be removed before forming any portion of the capacitive component or the inductive component. In implementations where the capacitive component and the inductive component are not formed, at least a portion of the substrate can be removed.

A possible process flow for producing at least a portion of the devices (e.g., device 100, device 200, device 300, device 500, device 800, and so forth) described herein can be summarized as follows: (1) deposit a seed layer, (2) form a first layer of resist material (e.g., a dry-film material), (3) pattern the first resist material, (4) plate a redistribution layer, (5) form of a second layer of resist material, (6) pattern the second resist material, (7) plate a conductive pillar, (8) remove the first and second resist material layers, (9) perform a sacrificial etch to remove the seed layer, (10) place one or more semiconductor die, (11) perform a reflow process, (12) fill with epoxy and cure, (13) perform a mechanical modification process (e.g., face grinding) and/or a chemical cleaning process (e.g., a cleaning process to remove silicon oxide), (14) perform a plating process and (15) form a solder finish. In some implementations, more than one redistribution layers can be formed in the device.

Another possible process flow for producing at least a portion of the devices (e.g., device 100, device 200, device 300, device 500, device 800, and so forth) described herein can be summarized as follows: (1) drill a hole for a via through a substrate, (2) deposit a first seed layer for a first redistribution layer and in the hole, (3) form (e.g., attach) a first layer of resist material, (4) form (e.g., plate) the first redistribution layer, (5) form a second layer (e.g., a pillar layer) of resist material, (6) pattern the second layer of the resist material, (7) form (e.g., plate) a conductive pillar layer, (8) remove the first layer and the second layer of resist material, (9) perform a sacrificial etch to remove the first seed layer, (10) deposit a magnetic material, (11) deposit a second seed layer, (12) form (e.g., attach) a third layer of resist material, (13) form (e.g., plate) a second redistribution layer, (14) form a final coat, and (15) perform marking (e.g., a scribe marking, a laser marking).

FIG. 11A is a diagram that illustrates a cross-sectional view of a device 1100 coupled to an external block 1190. FIG. 11A is cut along line J15 of a bottom view of the device 1100 shown in FIG. 11B. The bottom view of the device 1100 shown in FIG. 11B is along the plane J1.

As shown in FIG. 11A, a substrate 1130 is coupled to a molding layer 1140. Semiconductor die 1142 and a semiconductor die 1145 are disposed within the molding layer 1140. Only a portion of interconnection integration (e.g., contacts 1131 to the semiconductor die 1142, 1145) is illustrated within this embodiment for simplicity. Magnetic integration and/or isolation integration could be included in variations of this device 1100.

As shown in FIG. 11A, a surface plating layer portion 1144 is disposed between the semiconductor die 1142 and the external block 1190. Similarly, a surface plating layer portion 1146 is disposed between the semiconductor die 1145 and the external block 1190. The surface plating layer portion 1144 and the surface plating layer portion 1146 can be formed using the same surface plating layer formation process.

Also, as shown in FIG. 11A, an insulator 1143 is disposed between the surface plating layer portion 1144 and the surface plating layer portion 1146. Specifically, the insulator 1143 is disposed between the surface plating layer portions 1144, 1146 along plane J1, which is aligned along a surface of the molding layer 1140. Accordingly, the insulator 1143 and the surface plating layer portions 1144, 1146 are aligned along the plane J1. In addition, a bottom surface of each of the semiconductor die 1142, 1145 is aligned along the plane J1.

The insulator 1143 has a lateral dimension J3 (e.g., length, width) along direction A2 that is greater than a distance J2 (also can be referred to as a spacing or a gap) between the semiconductor die 1142 and the semiconductor die 1145. Specifically, the distance J2 can be between (e.g., can be a minimum distance between) a sidewall of the semiconductor die 1142 and a sidewall of the semiconductor die 1145. In other words, the distance J2 between the semiconductor die 1142, 1145 is less than the lateral dimension J3 of the insulator 1143. The distance J2 can correspond with a lateral dimension of a portion of the molding layer 1140 disposed between the semiconductor die 1142, 1145. The lateral dimension J3 corresponds with approximately a distance between the surface plating layer portion 1144 and the surface plating layer portion 1146. In some implementations, the sidewall of the semiconductor die 1142 and the sidewall of the semiconductor die 1145 can be parallel or non-parallel.

The configuration shown in FIG. 11A can be particularly important in high voltage applications where the dimension J3 can have a minimum size defined to prevent, for example, breakdown between components included in the device 1100. This configuration, which includes the layer 1143, can be used to decrease an overall size of the device 1100 while maintaining minimum distances between components (e.g., semiconductor die 1142 and 1145). In such embodiments, the plating layer 1144 does not cover an entire bottom surface of, for example, semiconductor die 1142.

As shown in FIG. 11A, a lateral dimension J4 of the surface plating layer portion 1146 is smaller than a lateral dimension J5 of the semiconductor die 1145. Similarly, a lateral dimension J6 of the surface plating layer portion 1144 is smaller than a lateral dimension J7 of the semiconductor die 1142.

In some implementations, a minimum distance between surface plating layer portions can be defined so that shorting, undesirable contamination, and/or other issues can be avoided. For example, a first surface plating layer portion can be inadvertently electrically shorted to a second surface plating layer portion via contamination, misalignment, and/or so forth if the first surface plating layer portion is too close to the second surface plating layer portion.

In this implementation, the insulator 1143 is formed between the surface plating layer portion 1144 and the surface plating layer portion 1146 so that a minimum desired distance (e.g., distance requirement) between the surface plating layer portions 1144, 1146 can be satisfied. This minimum distance can be satisfied while the distance J2 between the semiconductor die 1142 and the semiconductor die 1145 is less than the minimum distance. Accordingly, the semiconductor die 1142 and semiconductor die 1145 can be closer to one another than a minimum distance for spacing between surface plating layer portions of a surface plating layer.

As shown in FIG. 11A, at least a portion of the surface plating layer portion 1144 is disposed between a first portion of the semiconductor die 1142 and the external block 1190, and at least a portion of the insulator 1143 is disposed between a second portion of the semiconductor die 1142 and the external block 1190. Accordingly, at least a portion of the surface plating layer is coupled to a first surface (along the plane J1) of the semiconductor die 1142, and at least a portion of the insulator 1143 is coupled to a second surface (along the plane J1) of the semiconductor die 1142.

As shown in FIG. 11B, the surface plating layer portion 1144 has a surface area less than a surface area of the semiconductor die 1142. Similarly, the surface plating layer portion 1146 has a surface area less than a surface area of the semiconductor die 1145. In other words, at least a portion of a perimeter of the surface plating layer portion 1144 is disposed within, or coincides with, at least a portion of a perimeter of the surface area of the semiconductor die 1142.

In some implementations, a surface plating layer portion can have a lateral dimension (e.g., width, length) that is greater than a lateral dimension of a semiconductor die on which the surface plating layer portion is coupled. For example, the surface plating layer portion 1144 can have a lateral dimension J10 that is greater than a corresponding (or parallel) lateral dimension of the semiconductor die 1142 even though the lateral dimension J6 of the surface plating layer portion 1144 is less than the corresponding (or parallel) lateral dimension J7 of the semiconductor die 1142. Thus, at least a portion of a perimeter of the surface plating layer portion 1144 can intersect at least a portion of a perimeter of the surface area of the semiconductor die 1142. Said differently, at least a first portion of a perimeter of the surface plating layer portion 1144 can be disposed outside of at least a perimeter of the surface area of the semiconductor die 1142, and at least a second portion of a perimeter of the surface plating layer portion 1144 can be disposed within the perimeter of the surface area of the semiconductor die 1142.

Although not shown in FIG. 11A or 11B, in some implementations, the insulator 1143 may be coupled to a bottom surface of only one of the semiconductor die 1142, 1145. In such implementations, a bottom surface can be entirely, or at least partially, covered by a surface plating layer portion.

The insulator 1143 (which can be referred to or included in an insulating layer) can be formed based on a variation of the semiconductor processing described above. In some implementations, an insulating layer (not shown) can be formed on (e.g., disposed on) the plane J1 before a surface plating layer is formed (e.g., formation of surface plating layer 870 shown in FIG. 8G, formation of surface plating layer 356 shown in FIG. 6G).

In some implementations, the insulating layer can be disposed on the device 1100 before removal of portions of the molding layer 1140 has been performed to expose the bottom surfaces of the semiconductor die 1142, 1145. In alternative implementations, the insulating layer can be formed on the molding layer 1140 and each of the bottom surfaces of the semiconductor die 1142, 1145 after the bottom surfaces of the semiconductor die 1142, 1145 have been exposed.

After the insulating layer has been disposed on the device 1100, the insulating layer can be patterned through chemical processing (e.g., etching) and/or mechanical processing (e.g., grinding, polishing) to form the insulating layer 1143. After the insulator 1143 has been formed, the surface plating layer portions 1144, 1146 can be formed. A surface defined by the insulator 1143 and the surface plating layer portions 1144, 1146 can be chemically and/or mechanically processed until the surface is planar (e.g., substantially planar).

Figure 12:
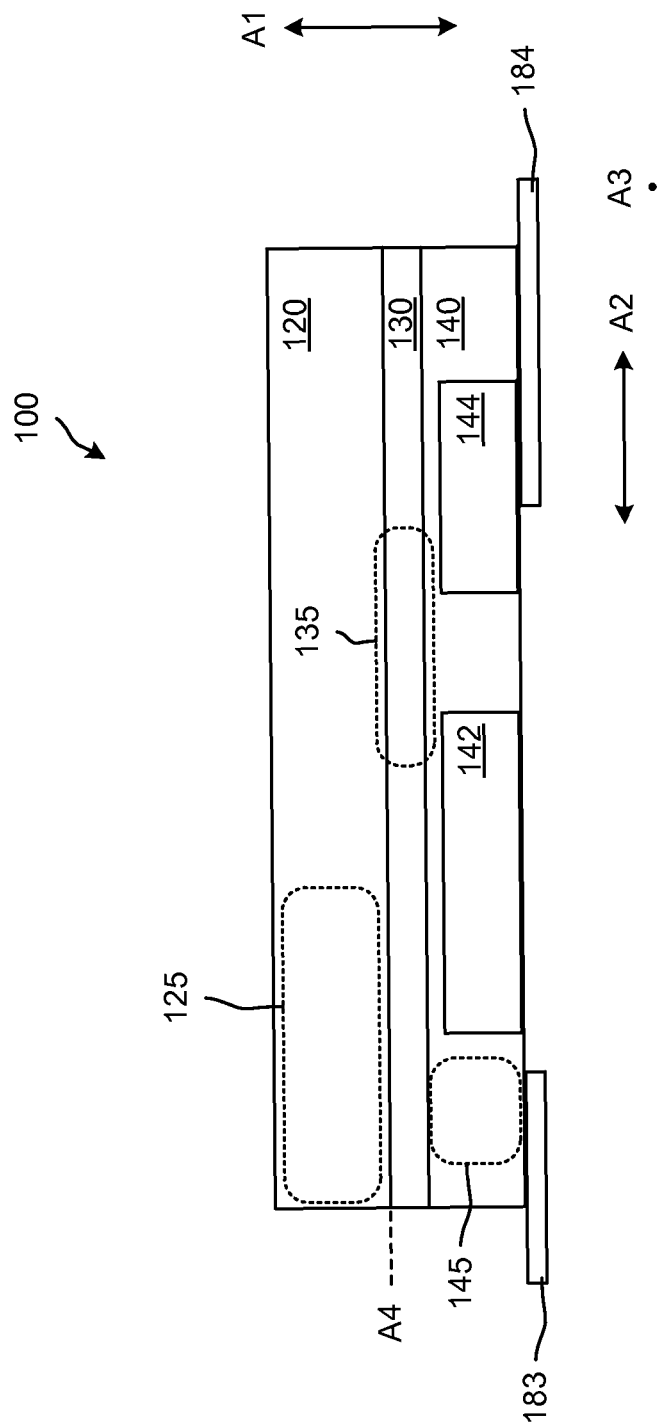
FIG. 12 is a diagram that illustrates a side cross-sectional view of a variation of the device shown in FIG. 1.

FIG. 12 is a diagram that illustrates a side cross-sectional view of a variation of the device 100. In some implementations, the device 100 can be referred to as a packaged device or can be referred to as a package. As shown in FIG. 12, the device 100 is coupled to conductors 183, 184 included in a lead frame (also can be referred to as a lead frame structure).

In some implementations, the device 100 can be coupled to, for example, an external block (e.g., a printed circuit board) via the lead frame. In some implementations, the conductors 183, 184 of the lead frame can be, or can be considered a part of, an external block (such as external block 190 shown in FIG. 1). In some implementations, the conductors 183, 184 of the lead frame can be considered a part of the device 100. In some implementations, one or more of the conductors 183, 184 can be made of a conductive material such as a metal or metal alloy.

In some implementations, one or more of the conductors 183, 184 can be coupled to one or more portions of the device 100 via a surface plating layer. In some implementations, one or more of the conductors 183, 184 can be coupled to one or more portions of the device 100 via a surface plating layer such as those described above.

For example, as shown in FIG. 12, conductor 183 can be coupled to (e.g., electrically coupled to) one or more interconnection components included in the interconnection region 145. The interconnection component can be used to electrically couple the conductor 183 to one or more components (e.g., a component included in the passive component region 125, a component included in the passive component region 135. As another example, as shown in FIG. 12, conductor 183 can be coupled to (e.g., electrically coupled to) the semiconductor die 144.

As shown in FIG. 12, each of the conductors 183, 184 has a relatively flat cross-sectional profile or shape. In some implementations, one or more of the conductors 183, 184 can have a different shape or profile. For example, one or more of the conductors 183, 184 can have a curved portion, a recessed portion, a protrusion, a bent portion, orthogonally oriented portions, a tapered portion, a notched portion, and/or so forth. In some implementations, a lead frame can include more conductors than shown in FIG. 12, or less conductors than shown in FIG. 12. The conductors can have a thickness, length, and/or width different than the conductors 183, 184 shown in FIG. 12.

Any of the implementations described above (which can be variations of FIG. 1) can similarly be coupled to a lead frame including conductors such as those shown in FIG. 12. For example, an inductive component (which can be stand-alone or can include interconnection integration) as disclosed herein can be coupled to a lead frame as described herein. As another example, a capacitive component (which can be stand-alone or can include interconnection integration) as disclosed herein can be coupled to a lead frame as described herein.

Figure 13A:
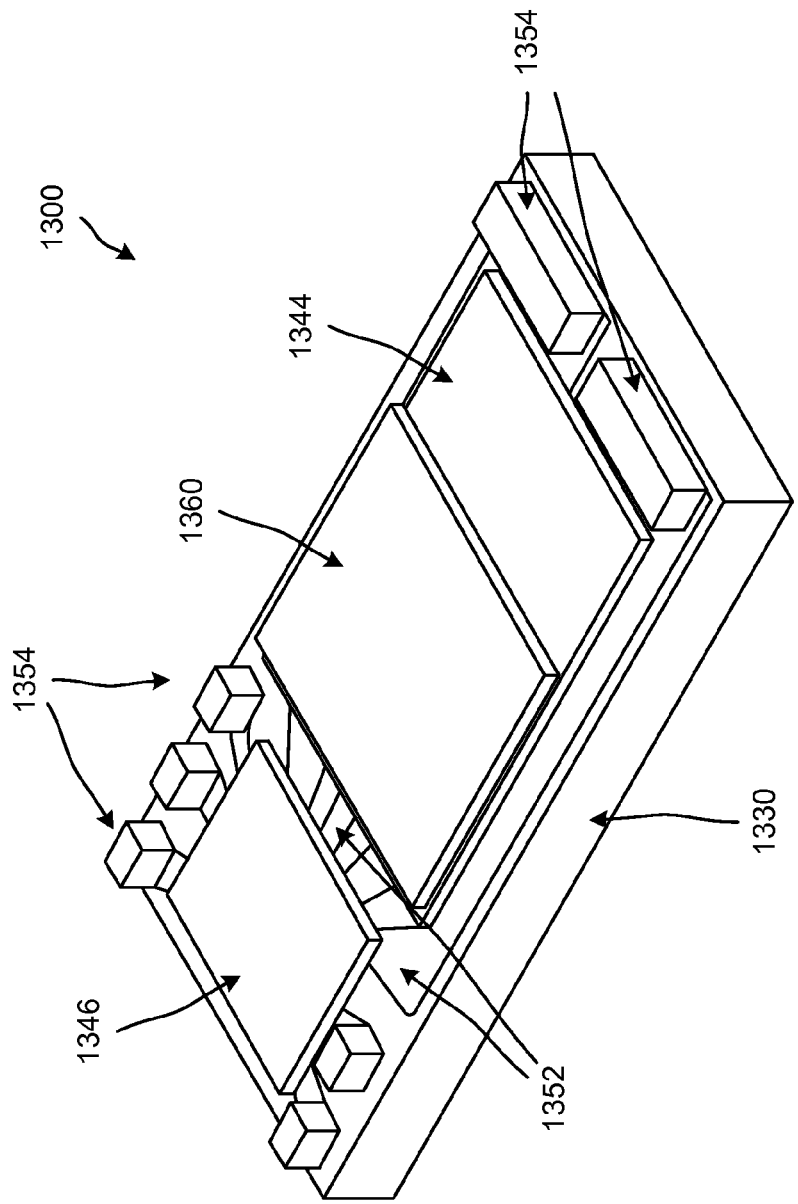
FIG. 13A is a diagram that illustrates a perspective view of a device, or a portion thereof, according to an implementation.

FIG. 13A is a diagram that illustrates a perspective view of a device 1300, or a portion thereof, according to an implementation. As shown in FIG. 13A, the device 1300 includes a plurality of interconnection components coupled to a substrate 1330. In this implementation, several of the interconnection components are defined by portions of a redistribution layer 1352 (which can be referred to as redistribution layer portions, or as contacts of the redistribution layer) and conductive pillars 1354. In this implementation, only portions (or structures) of the redistribution layer 1352 and portions (or structures) of the conductive pillars 1354 are labeled. In this implementation, the redistribution layer 1352 is disposed between the substrate 1330 and the conductive pillars 1354 (which can be referred to as a conductive pillar layer).

As shown in FIG. 13A, the interconnection components and semiconductor die 1342 and 1344 are coupled to the redistribution layer 1352. In this illustration, a molding layer, a surface plating layer, an external block, and so forth are not shown.

As shown in FIG. 13A, a plate 1360 (also can be referred to as a thermal plate) is coupled to the semiconductor die 1344. In some implementations, the plate 1360 can be referred to as a heat slug. The plate 1360 is aligned along a plane (e.g., plane A4 shown in FIG. 1) that is parallel to a plane along which the semiconductor die 1344 is aligned. In some implementations, the plate 1360 can be coupled to the semiconductor die 1344 using a solder (e.g., a solder layer), a conductive epoxy, and/or so forth. In some implementations, plate 1360 can be deposited on the semiconductor die 1344 using, for example, an electroplating process, a deposition process, and/or so forth.

The plate 1360 can be configured to transfer heat away (e.g., dissipate heat, conduct heat away) from the semiconductor die 1344. In other words, the plate 1360 can function as a heat sink for at least a portion of the semiconductor die 1344. In some implementations, heat can be conducted away from the semiconductor die 1344 using the plate 1360 to, for example, a PCB board to which the plate 1360 is coupled. In some implementations, heat can be dissipated (or transferred) from the semiconductor device 1344 in a first direction through the plate 1360 and in a second direction (opposite the first direction) from the semiconductor device 1344 toward the substrate 1330.

In some implementations, the plate 1360 can have a thickness (or vertical dimension) between a few microns and several millimeters (mm) (e.g., 1 mm, 2 mm). In some implementations, the semiconductor die 1344 can have a thickness (or vertical dimension) that is relatively thin. Accordingly, the plate 1360 can be coupled to the semiconductor die 1344 to support (or add structural rigidity to) the semiconductor die 1344.

In some implementations, the plate 1360 can be a conductive plate that can be used to transmit one or more electrical signals from the semiconductor die 1344 to another device (not shown). For example, the plate 1360 can function as a source contact or pad, as a drain contact or pad, as a gate contact or pad, as a signal contact or pad, or so forth.

As a specific example, the plate 1360 can function as a drain for the semiconductor die 1344. In some implementations, the plate 1360 can function as a common drain for multiple devices (e.g., multiple MOSFET devices) included in the semiconductor die 1344. For example, the plate 1360 can function as a drain for a first MOSFET device (e.g., a first vertical MOSFET formed using a first plurality of trenches) and the plate 1360 can function as a drain for a second MOSFET device (e.g., a second vertical MOSFET device formed using a second plurality of trenches).

In some implementations, the plate 1360 can have dimensions that can be used in conjunction with multiple different die sizes within the device 1300. For example, a first plate can have dimensions that can be coupled to a first semiconductor die included in a first device. A second plate can have the same dimensions as the first plate, but can be coupled to a second semiconductor die included in a second device. Accordingly, the first device and the second device can each have a pad layout (based on the same dimensions of the first plate and the second plate).

In this implementation, the plate 1360 shown as having a surface area (e.g., footprint, outer profile) less than a surface area of the semiconductor die 1344 (i.e., partial coverage). Accordingly, a portion of the surface area of the semiconductor die 1344 is not covered by the plate 1360. In other words, at least a portion of the semiconductor die 1344 is exposed (and can be coupled to another layer such as a molding layer). In some implementations, the plate 1360 can have a surface area that is equal to or greater than the surface area of the semiconductor die 1344 (i.e., full coverage).

In some implementations, more than one plate can be coupled to a semiconductor die (e.g., the semiconductor die 1344). In some implementations, multiple plates can be coupled to a same side or surface (e.g., planar surface) of the semiconductor die. In such implementations, the plates can be thermally insulated and/or electrically insulated from one another. For example, a first plate coupled to a semiconductor die can be thermally insulated from and/or electrically insulated from a second plate coupled to the semiconductor die.

Although not shown in FIG. 13A, a plate (not shown) can be coupled to the semiconductor die 1346. In such implementations, the plate coupled to the semiconductor die 1346 can be thermally and/or electrically insulated from the plate 1360. In some implementations, the plate 1360 can be modified so that it can be coupled to the semiconductor die 1344 and the semiconductor die 1346.

In some implementations, the plate 1360 can be made of a conductive material (e.g., electrically conductive material, a thermally conductive material) such as copper, aluminum, gold, a metal alloy, and/or so forth.

Although illustrated a single continuous slug having a rectangular shape, the plate 1360 can have a different shape. In some implementations, the plate 1360 can be patterned with a specific pattern using one or more processing techniques.

In some implementations, the plate 1360 can be coupled to the semiconductor die 1344 before the semiconductor die 1344 is included in the device 1300. In some implementations, the plate 1360 can be coupled to the semiconductor die 1344 after the semiconductor die 1344 is included in (e.g., coupled to) the device 1300.

Figure 13B:
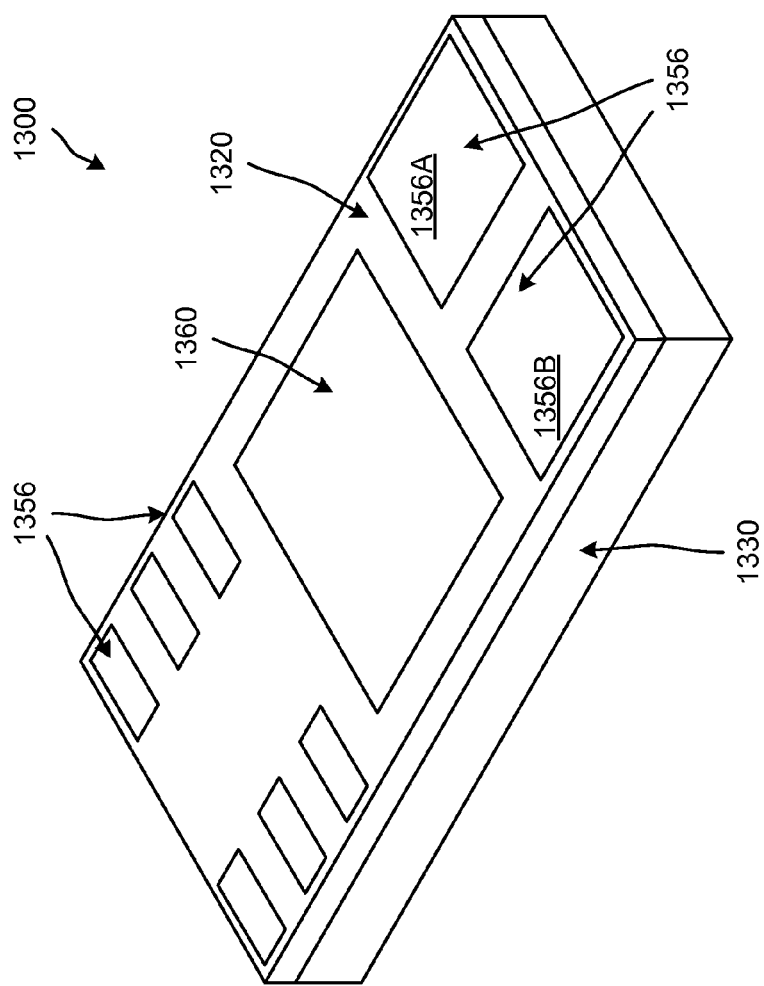
FIG. 13B is a diagram that illustrates a perspective view of the device shown in FIG. 13A with additional processing layers, according to an implementation.

FIG. 13B is a diagram that illustrates a perspective view of the device 1300 shown in FIG. 13A with additional processing layers, according to an implementation. As shown in FIG. 13B, the semiconductor die 1344, 1346, and the interconnection components are encapsulated within (e.g., entirely disposed within) molding layer 1320. A top surface of the plate 1360 is exposed through the molding layer 1320. In some implementations, the top surface of the plate 1360 can be defined after, for example, a mechanical polish process.

As shown in FIG. 13B, a surface plating layer 1356 (or portions thereof) are coupled to one or more of the interconnection components. Only some portions of the surface plating layer 1356 are labeled. The surface plating layers 1356 can function as conductors through which other components (e.g., devices, PCB, and/or so forth) can be coupled.

Figure 14C:
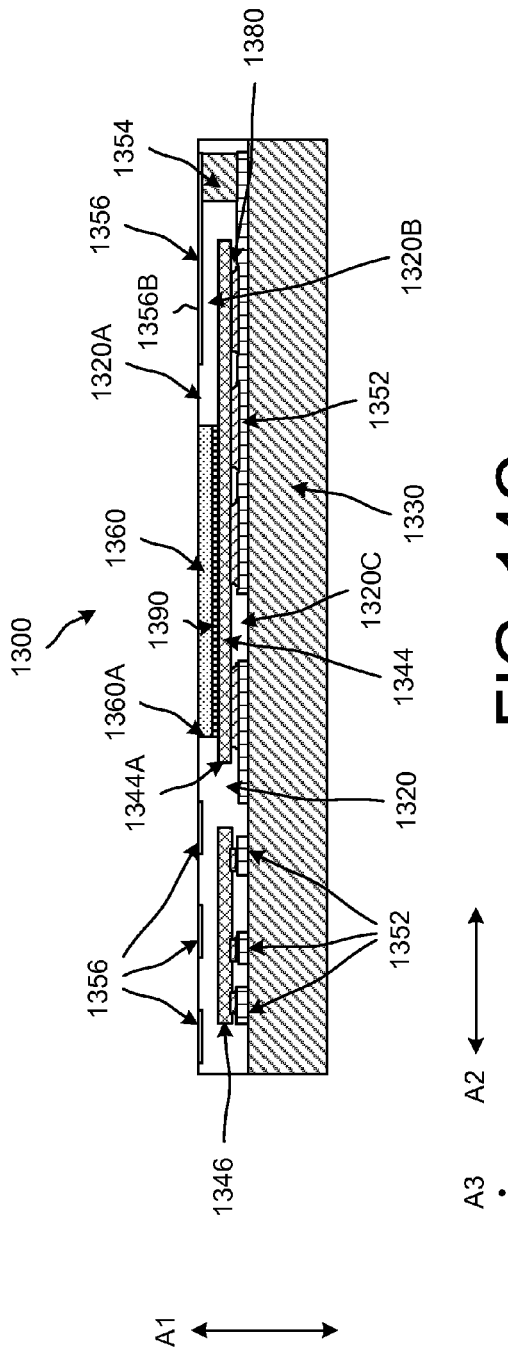
FIG. 14C illustrates a side cross-sectional view of the device shown in FIG. 14A along another line.

FIG. 14A is a diagram that illustrates a layout view (or plan view) of the device 1300 shown in FIGS. 13A and 13B. As illustrated in FIG. 14A, the plate 1360 has a surface area that is smaller than a surface area of the semiconductor die 1344. Because the plate 1360 has a surface area that is smaller than a surface area of the semiconductor die 1344, a surface area of each of the portions 1356A, 1356B of the surface plating layer 1356 can be relatively large. Specifically, the surface area of each of the portions 1356A, 1356B of the surface plating layer 1356 would be smaller, or the overall package size (e.g., footprint) of the device 1300 would have to be larger because of the lack of space on the surface of the device 1300. These features are more clearly illustrated in the side cross-sectional view shown in FIG. 14C.

FIG. 14C illustrates a side cross-sectional view of the device 1300 shown in FIG. 14A along line Z1. As shown in FIG. 14C, the portion 1356B of the surface plating layer 1356 is disposed above (e.g., disposed vertically above) at least a portion of the semiconductor die 1344 such that a portion 1320B of the molding layer 1320 is disposed between the portion 1356B of the surface plating layer 1356 and the semiconductor die 1344. This configuration is possible because the plate 1360 is coupled to only a portion of the semiconductor die 1344. As shown in FIG. 14C, a portion 1320A of the molding layer 1320 is disposed (e.g., laterally disposed) between the plate 1360 and the portion 1356B of the surface plating layer 1356. If the plate 1360 were coupled to a larger portion of the semiconductor die 1344, a size (e.g., surface area when viewed from above) of the portion 1356B of the surface plating layer 1356 would have to be decreased or moved laterally within the semiconductor device 1300 resulting in an increase in an overall size of the semiconductor device 1300.

The plate 1360 has an edge 1360A that is offset (e.g., laterally offset) from an edge 1344A of the semiconductor die 1344. In some implementations, the edge 1360A can offset outside of a surface area (offset to the left in this figure) of the semiconductor die 1344. In some implementations, the edge 1360A can be aligned (e.g., vertically aligned) with the edge 1344A of the semiconductor die 1344.

As shown in FIG. 14C, the molding layer 1320, the plate 1360, and the surface plating layer 1356 collectively define a planar surface (e.g., a substantially planar surface). In some implementations, the planar surface can be defined using one or more mechanical modification processes (e.g., a chemical mechanical polishing process). In some implementations, one or more of the molding layer 1320, the plate 1360 and/or the surface plating layer 1356 can have a surface that is disposed above or below a planar surface associated with the device 1300.

As shown in FIG. 14C, the semiconductor die 1344 and the semiconductor die 1346 are coupled to portions of the redistribution layer 1352 via a coupling layer 1380. Similarly, the plate 1360 is coupled to the semiconductor die 1304 via a coupling layer 1390. The coupling layer 1380 and/or the coupling layer 1390 (as mentioned above and in connection with the figures above) can include one or more of a solder, a conductive epoxy, and are so forth.

The semiconductor die 1344 is disposed between at least a portion of the plate 1360 and at least a portion of the redistribution layer 1352. As shown in FIG. 14C, a portion 1320C of the molding layer 1320 is disposed between a first portion of the redistribution layer 1352 and a second portion of the redistribution layer 1352.

Although not illustrated in FIG. 14C, the semiconductor die 1346 can have a vertical dimension (e.g., thickness) that is different than (e.g., greater than, less than) a vertical dimension (e.g., thickness) of the semiconductor die 1344. In some implementations, the vertical dimension of the semiconductor die 1346 can be equal to the vertical dimension of the semiconductor die 1344. In some implementations, the plate 1360 can have a vertical dimension that is different than (e.g., greater than, less than) a vertical dimension of the semiconductor die 1346 and/or the semiconductor die 1344. In some implementations, the vertical dimension of the plate 1360 can be equal to the vertical dimension of the semiconductor die 1346 and/or the semiconductor die 1344.

FIG. 14B illustrates a side cross-sectional view of the device 1300 shown in FIG. 14A along line Z2. As shown in FIG. 14B, the semiconductor die 1346 is coupled to several portions of the redistribution layer 1352 via portions of the coupling layer 1380. As shown in FIG. 14B and in FIG. 14C, conductive pillars 1354 are disposed between the surface plating layer 1356 and the redistribution layer 1352.

The implementations and features illustrated in FIGS. 13A through 14 can be combined with any of the implementations shown and described in connection with, for example, FIGS. 1 through 12.

Figure 15:
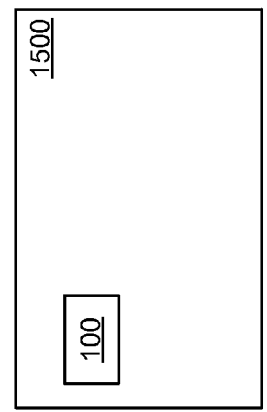
FIG. 15 is a diagram that illustrates the device shown, for example, in FIG. 1 included in a computing device.

Implementations of the various devices (e.g., device 100, device 200, device 300, device 500, device 800, and so forth) (e.g., packages) described herein can be included in a variety of devices or systems. FIG. 15 is a diagram that illustrates the device 100 shown in, for example, FIG. 1 included in an electronic device 1500. The electronic device 1500 can be, or can include, for example, a laptop-type device with a traditional laptop-type form factor. In some implementations, the electronic device 1500 can be, or can include, for example, a wired device and/or a wireless device (e.g., Wi-Fi enabled device), a computing entity (e.g., a personal computing device), a server device (e.g., a web server), a mobile phone, an audio device, a motor control device, a power supply (e.g., an off-line power supply), a personal digital assistant (PDA), a tablet device, e-reader, a television, an automobile, and/or so forth. In some implementations, the electronic device 1500 can be, or can include, for example, a display device (e.g., a liquid crystal display (LCD) monitor, for displaying information to the user), a keyboard, a pointing device (e.g., a mouse, a trackpad, by which the user can provide input to the computer).

In some implementations, the electronic device 1500 can be, or can include, for example, a back-end component, a data server, a middleware component, an application server, a front-end component, a client computer having a graphical user interface or a Web browser through which a user can interact with an implementation, or any combination of such back-end, middleware, or front-end components. The device 100 (and/or the electronic device 1500) described herein may be interconnected by any form or medium of digital data communication, e.g., a communication network. Examples of communication networks include a local area network (LAN) and a wide area network (WAN), e.g., the Internet.

In some implementations, an apparatus can include a substrate. The apparatus can include a redistribution layer coupled to the substrate and including a first redistribution layer portion and a second redistribution layer portion. The apparatus can include a first semiconductor die having a first surface coupled to the first redistribution layer portion. The apparatus can also include a second semiconductor die having a first surface coupled to the second redistribution layer portion where the first semiconductor die has a second surface separated by a minimum distance from a second surface of the second semiconductor die. The apparatus can further include a first conductor coupled to a third surface of the first semiconductor die where the third surface of the first semiconductor die is on a side of the first semiconductor die opposite the first surface of the first semiconductor die and where the first conductor has a surface area less than a surface area of the third surface of the first semiconductor die. The apparatus can include a second conductor coupled to a third surface of the second semiconductor die where the third surface of the second semiconductor die is on a side of the second semiconductor die opposite the first surface of the second semiconductor die. The first conductor can be separated from the second conductor by a distance greater than the minimum distance.

In some implementations, the second surface of the first semiconductor die can be aligned parallel to the second surface of the second semiconductor die. The apparatus can include an insulator disposed on the third surface of the first semiconductor die where the surface area of the first conductor and a surface area of the insulator have a combined surface area substantially equal to the surface area of the third surface of the first semiconductor die.

In some implementations, the first redistribution layer portion can be a first capacitive plate of a capacitive component, and the redistribution layer can be a first redistribution layer coupled to a first side of the substrate. The apparatus can include a second redistribution layer including a second capacitive plate of the capacitive component. The first semiconductor die can include a first semiconductor device capacitively coupled to a second semiconductor device included in the second semiconductor device. In some implementations, the first semiconductor die can include a high voltage semiconductor device.

In one general aspect, an apparatus can include a first molding layer, a second molding layer, and a substrate disposed between the first molding layer and the second molding layer. The apparatus can include an inductive component having at least a portion coupled to the substrate. The apparatus can include a semiconductor die disposed in the first molding layer and including a semiconductor device, the semiconductor device being electrically coupled to the capacitive component.

In some implementations, the second molding layer includes a magnetic substance. The inductive component can include a conductive element and can include at least a portion of the magnetic substance. In some implementations, the apparatus can include a first capacitive plate disposed in the first molding layer on a first side of the substrate and a second capacitive plate disposed in the second molding layer on a second side of the substrate.

In some implementations, the semiconductor die is a first semiconductor die and the semiconductor device is a first semiconductor device, and the first capacitive plate and the second capacitive plate defining at least a portion of a first capacitor. The apparatus can include a third capacitive plate disposed in the first molding layer on the first side of the substrate, the second capacitive plate and the third capacitive plate defining at least a portion of a second capacitor. The apparatus can include a second semiconductor device including a second semiconductor device, and the second semiconductor die can be electrically coupled to the third capacitive plate.

In some implementations, the semiconductor die is a first semiconductor die and the semiconductor device is a first semiconductor device. The apparatus can include a second semiconductor die disposed in the first molding layer and including a second semiconductor device, and a conductive via disposed in the substrate and electrically coupling the second semiconductor device to the second capacitive plate.

In some implementations, the semiconductor die is a first semiconductor die and the semiconductor device is a first semiconductor device. The apparatus can include a second semiconductor die including a second semiconductor device. The second semiconductor die can be disposed in the first molding layer, and the first semiconductor device can be electrically isolated from the second semiconductor device via the capacitive component.

In some implementations, the inductive component is a first inductive component. The apparatus can include a second inductive component disposed in the second molding layer, and the first inductive component and the second inductive component can collectively define a transformer. In some implementations, the second molding layer includes a first molding material, and a second molding material disposed between the first molding material and the substrate. At least the first molding material can include a magnetic substance. In some implementations, the substrate includes a ceramic.

In some implementations, the apparatus can include a plate coupled to at least a portion of the semiconductor die. In some implementations, the inductive component includes a wire. In some implementations, the apparatus can include an electronic device.

In another general aspect, an apparatus can include a first redistribution layer disposed on a first side of a substrate, where the first redistribution layer includes a first redistribution layer portion and a second redistribution layer portion. The apparatus can include a conductive pillar coupled to the first redistribution layer portion of the first redistribution layer, and a semiconductor die can include a semiconductor device coupled to the second redistribution layer portion of the first redistribution layer. The apparatus can include a second redistribution layer disposed on a second side of the substrate, and the second redistribution layer can include at least one of a capacitive plate of a capacitive component or a portion of an inductive component. The apparatus can include a first molding layer encapsulating at least a portion of the semiconductor die on the first side of the substrate and encapsulating at a least a portion of the first redistribution layer, and a second molding layer disposed on the second side of the substrate.

In some implementations, the second molding layer includes a magnetic substance. In some implementations, the apparatus can include a surface plating layer having a portion aligned along a surface of the first molding layer. The first redistribution layer and the conductive pillar can have a combined thickness substantially equal to a thickness of the first molding layer between the substrate and the surface plating layer.

In some implementations, the apparatus can include a surface plating layer having a portion aligned along a surface of the first molding layer. The first redistribution layer and the conductive pillar can extend between the substrate and the surface plating layer.

In some implementations, the capacitive plate is a first capacitive plate of the capacitive component, and the first redistribution layer can include a portion defining a second capacitive plate of the capacitive component. The substrate can have a portion defining a dielectric between the first capacitive plate and the second capacitive plate.

In some implementations, the capacitive plate is a first capacitive plate, and the second redistribution layer portion of the first redistribution layer is a second capacitive plate. In some implementations, the second redistribution layer includes a first portion defining the capacitive plate and a second portion defining the portion of the inductive component.

In some implementations, the conductive pillar is a first conductive pillar, the second redistribution layer including a portion defining the portion of the inductive component. The apparatus can include a second conductive pillar coupled to the second redistribution layer, and a third redistribution layer including a portion coupled to the second conductive pillar. The portion of the second redistribution layer, the second conductive pillar, and the portion of the third redistribution layer collectively can define the portion of the inductive component.

In another general aspect, an apparatus can include a substrate, a molding layer disposed on the substrate, and a first semiconductor die disposed within the molding layer. The apparatus can include a second semiconductor die disposed within the molding layer where the second semiconductor die has a sidewall separated from a sidewall of the first semiconductor die by a first distance. The apparatus can include a first conductor coupled to a surface of the first semiconductor die and aligned along a plane. In some implementations, the surface of the first semiconductor die can be substantially orthogonal to the sidewall of the first semiconductor die. The apparatus can also include a second conductor coupled to a surface of the second semiconductor die and aligned along the plane where the first conductor can be separated from the second conductor by a second distance greater than the first distance.

In some implementations, the sidewall of the first semiconductor die faces at least a portion of the sidewall of the second semiconductor die. In some implementations, the apparatus can include an insulator having least a portion aligned along the plane and disposed between the first conductor and the second conductor.

In some implementations, the first distance is a minimum distance between the sidewall of the first semiconductor die and the sidewall of the second semiconductor die. The apparatus can include an insulator having a portion disposed between the first conductor and the second conductor, and the second distance can be a minimum width of the portion.

In some implementations, the apparatus can include at least one capacitive plate coupled to the substrate. In some implementations, the apparatus can include the first semiconductor die includes a high voltage semiconductor device.

In yet another general aspect, a method can include forming a redistribution layer on a substrate using a first electroplating process, and forming a conductive pillar on the redistribution layer using a second electroplating process. The method can include coupling a semiconductor die to the redistribution layer, and can include forming a molding layer encapsulating at least a portion of the redistribution layer and at least a portion of the conductive pillar.

In some implementations, the substrate has a rectangular or square shape and is a ceramic substrate. In some implementations, the redistribution layer is a first redistribution layer formed on a first side of the substrate and including a first capacitive plate. The method can include forming a second redistribution layer on a second side of the substrate and including a second capacitive plate corresponding to the first capacitive plate.

In some implementations, the method can include forming a surface plating layer on at least a portion of the semiconductor die and on at least a portion of the conductive pillar. In some implementations, the method can include forming a surface plating layer having a portion aligned along a surface of the molding layer. The redistribution layer and the conductive pillar can have a combined thickness substantially equal to a thickness of the molding layer between the substrate and the surface plating layer.

In some implementations, the redistribution layer is a first redistribution layer form on a first side of the substrate, and the molding layer is a first molding layer formed on the first side of the substrate. The method can include forming a second redistribution layer on a second side of the substrate, and forming a second molding layer encapsulating at least a portion of the second redistribution layer.

In some implementations, the redistribution layer is a first redistribution layer form on a first side of the substrate, and the molding layer is a first molding layer formed on the first side of the substrate. The method can include forming a second redistribution layer on a second side of the substrate, and forming a second molding layer encapsulating at least a portion of the second redistribution layer. The second molding layer can include a magnetic substance. In some implementations, at least a portion of the molding layer includes a magnetic substance. In some implementations, the redistribution layer is a first redistribution layer, and the method can include forming a second redistribution layer on the first redistribution layer where the forming the conductive pillar includes forming the conductive pillar on the second redistribution layer.

It may also be understood that when a layer is referred to as being on another layer or substrate, it can be directly on the other layer or substrate, or intervening layers may also be present. It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown in the figures as being directly on, directly connected or directly coupled can be referred to as such. The claims of the application may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
    a first molding layer;
    a second molding layer;
    a substrate disposed between the first molding layer and the second molding layer;
    an inductive component disposed in the second molding layer;
    a capacitive component having at least a portion coupled to the substrate;
    a semiconductor die disposed in the first molding layer and including a semiconductor device, the semiconductor device being electrically coupled to the capacitive component; and
    a redistribution layer disposed in the first molding layer and coupled to the substrate; and
    a conductive pillar coupled to the redistribution layer such that the redistribution layer is disposed between the substrate and the conductive pillar.

2. The apparatus of claim 1, wherein the second molding layer includes a magnetic substance, the inductive component including a conductive element and including at least a portion of the magnetic substance.

3. The apparatus of claim 1, further comprising:
    a first capacitive plate disposed in the first molding layer on a first side of the substrate and a second capacitive plate disposed in the second molding layer on a second side of the substrate.

4. The apparatus of claim 3, wherein the semiconductor die is a first semiconductor die and the semiconductor device is a first semiconductor device, the first capacitive plate and the second capacitive plate defining at least a portion of a first capacitor,
    the apparatus further comprising:
    a third capacitive plate disposed in the first molding layer on the first side of the substrate, the second capacitive plate and the third capacitive plate defining at least a portion of a second capacitor; and
    a second semiconductor die including a second semiconductor device, the second semiconductor device being electrically coupled to the third capacitive plate.

5. The apparatus of claim 3, wherein the semiconductor die is a first semiconductor die and the semiconductor device is a first semiconductor device,
    the apparatus further comprising:
    a second semiconductor die disposed in the first molding layer and including a second semiconductor device; and
    a conductive via disposed in the substrate and electrically coupling the second semiconductor device to the second capacitive plate.

6. The apparatus of claim 1, wherein the semiconductor die is a first semiconductor die and the semiconductor device is a first semiconductor device,
    the apparatus further comprising:
    a second semiconductor die including a second semiconductor device, the second semiconductor die disposed in the first molding layer, the first semiconductor device being electrically isolated from the second semiconductor device via the capacitive component.

7. The apparatus of claim 1, wherein the inductive component is a first inductive component,
    the apparatus further comprising:
    a second inductive component disposed in the second molding layer, the first inductive component and the second inductive component collectively defining a transformer.

8. The apparatus of claim 1, wherein the second molding layer includes:
    a first molding material; and
    a second molding material disposed between the first molding material and the substrate, at least the first molding material including a magnetic substance.

9. The apparatus of claim 1, wherein the substrate includes a ceramic.

10. The apparatus of claim 1, further comprising:
    a plate coupled to at least a portion of the semiconductor die.

11. The apparatus of claim 1, wherein the inductive component includes a wire.

12. The apparatus of claim 1, wherein the apparatus is included in an electronic device.

13. An apparatus, comprising:
    a first redistribution layer disposed on a first side of a substrate, the first redistribution layer including a first redistribution layer portion and a second redistribution layer portion;

a conductive pillar coupled to the first redistribution layer portion of the first redistribution layer;

a semiconductor die including a semiconductor device coupled to the second redistribution layer portion of the first redistribution layer;

a second redistribution layer disposed on a second side of the substrate, the second redistribution layer including a portion of an inductive component;

a first molding layer encapsulating at least a portion of the semiconductor die on the first side of the substrate and encapsulating at a least a portion of the first redistribution layer; and a second molding layer disposed on the second side of the substrate.

14. The apparatus of claim 13, wherein the second molding layer includes a magnetic substance.

15. The apparatus of claim 13, further comprising:

a surface plating layer having a portion aligned along a surface of the first molding layer, the first redistribution layer and the conductive pillar having a combined thickness substantially equal to a thickness of the first molding layer between the substrate and the surface plating layer.

16. The apparatus of claim 13, further comprising:

a surface plating layer having a portion aligned along a surface of the first molding layer, the first redistribution layer and the conductive pillar extending between the substrate and the surface plating layer.

17. The apparatus of claim 13, wherein the second redistribution layer includes a first capacitive plate of a capacitive component, the first redistribution layer including a portion defining a second capacitive plate of the capacitive component, the substrate having a portion defining a dielectric between the first capacitive plate and the second capacitive plate.

18. The apparatus of claim 13, wherein the second redistribution layer includes a first capacitive plate, the second redistribution layer portion of the first redistribution layer is a second capacitive plate.

19. The apparatus of claim 13, wherein the second redistribution layer includes a portion defining the portion of the inductive component.

20. The apparatus of claim 13, wherein the conductive pillar is a first conductive pillar, the second redistribution layer including a portion defining the portion of the inductive component, the apparatus further comprising:

a second conductive pillar coupled to the second redistribution layer; and a third redistribution layer including a portion coupled to the second conductive pillar, the portion of the second redistribution layer, the second conductive pillar, and the portion of the third redistribution layer collectively defining the portion of the inductive component.

21. An apparatus, comprising:

a substrate;

a first molding layer disposed on the substrate;

a second molding layer;

an inductive component disposed in the second molding layer;

a first semiconductor die disposed within the first molding layer;

a second semiconductor die disposed within the first molding layer, the second semiconductor die having a sidewall separated from a sidewall of the first semiconductor die by a first distance;

a first conductor coupled to a surface of the first semiconductor die and aligned along a plane; and a second conductor coupled to a surface of the second semiconductor die and aligned along the plane, the first conductor being separated from the second conductor by a second distance greater than the first distance.

22. The apparatus of claim 21, wherein the sidewall of the first semiconductor die faces at least a portion of the sidewall of the second semiconductor die.

23. The apparatus of claim 21, further comprising:

an insulator having least a portion aligned along the plane and disposed between the first conductor and the second conductor.

24. The apparatus of claim 21, wherein the first distance is a minimum distance between the sidewall of the first semiconductor die and the sidewall of the second semiconductor die, the apparatus further comprising:

an insulator having a portion disposed between the first conductor and the second conductor, the second distance being a minimum width of the portion.

25. The apparatus of the claim 21, further comprising:

at least one capacitive plate coupled to the substrate.

26. The apparatus of the claim 21, wherein the first semiconductor die includes a high voltage semiconductor device.

27. The apparatus of claim 13, wherein the conductive pillar is coupled to the first redistribution layer portion of the first redistribution layer such that the first redistribution layer is disposed between the conductive pillar and the substrate.

28. The apparatus of claim 13, wherein the semiconductor device is coupled to the second redistribution layer portion of the first redistribution layer such that the second redistribution layer portion is disposed between the semiconductor device and the substrate.

29. The apparatus of claim 13, wherein the substrate includes a ceramic.

* * * * *

UNITED STATES PATENT AND TRADEMARK OFFICE
CERTIFICATE OF CORRECTION

PATENT NO. : 9,177,925 B2  
APPLICATION NO. : 14/092485  
DATED : November 3, 2015  
INVENTOR(S) : Ahmad Ashrafzadeh et al.

Page 1 of 1

It is certified that error appears in the above-identified patent and that said Letters Patent is hereby corrected as shown below:

ON THE TITLE PAGE

On the first page, in item (72), in column 1, in "Inventors", line 1, after "Ahmad" delete "R.".

On the first page, in item (72), in column 1, in "Inventors", line 2, after "Vijay" delete "G.".

On the first page, in item (73), in column 1, in "Assignee", line 1, delete "Fairfchild" and insert -- Fairchild --, therefor.

Signed and Sealed this
Twenty-second Day of March, 2016

Michelle K. Lee
*Director of the United States Patent and Trademark Office*